United States Patent
Sasaki et al.

(10) Patent No.: US 11,211,548 B2
(45) Date of Patent: Dec. 28, 2021

(54) SPIN CURRENT MAGNETIZATION REVERSAL ELEMENT, ELEMENT ASSEMBLY, AND METHOD FOR PRODUCING SPIN CURRENT MAGNETIZATION REVERSAL ELEMENT

(71) Applicant: TDK CORPORATION, Tokyo (JP)

(72) Inventors: Tomoyuki Sasaki, Tokyo (JP); Tatsuo Shibata, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 58 days.

(21) Appl. No.: 16/516,333

(22) Filed: Jul. 19, 2019

(65) Prior Publication Data
US 2019/0348598 A1   Nov. 14, 2019

Related U.S. Application Data

(62) Division of application No. 15/642,003, filed on Jul. 5, 2017, now Pat. No. 10,418,545.

(30) Foreign Application Priority Data

Jul. 29, 2016 (JP) .................................. 2016-149413
May 17, 2017 (JP) .................................. 2017-098340

(51) Int. Cl.
*H01L 43/02*  (2006.01)
*H01L 43/10*  (2006.01)
(Continued)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12
See application file for complete search history.

(56) References Cited

U.S. PATENT DOCUMENTS

| 4,944,831 | A | * | 7/1990 | Sibuet | ................. | G11B 5/3163 |
| | | | | | | 204/192.36 |
| 6,765,823 | B1 | | 7/2004 | Zhu et al. | | |

(Continued)

FOREIGN PATENT DOCUMENTS

| JP | 2011-138604 A | 7/2011 |
| JP | 2014-207469 A | 10/2014 |

(Continued)

OTHER PUBLICATIONS

Guoqiang Yu et al., "Current-Driven Perpendicular Magnetization Switching in Ta/CoFeB/[TaOx or MgO/TaOx] Films with Lateral Structural Asymmetry" Applied Physics Letters, vol. 105, pp. 102411-102411-5, (2014).

(Continued)

*Primary Examiner* — Marcos D. Pizarro
*Assistant Examiner* — Sue Tang
(74) *Attorney, Agent, or Firm* — Oliff PLC

(57) ABSTRACT

This spin current magnetization reversal element includes a magnetoresistance effect element having a first ferromagnetic metal layer having a fixed magnetization direction, a second ferromagnetic metal layer having a variable magnetization direction, and a non-magnetic layer sandwiched between the first ferromagnetic metal layer and the second ferromagnetic metal layer, and spin-orbit torque wiring which extends in a first direction that intersects the stacking direction of the magnetoresistance effect element, and contacts the surface of the magnetoresistance elect element on the side facing the second ferromagnetic metal layer, wherein at least one surface of the second ferromagnetic (Continued)

metal layer in the stacking direction has an inclined surface that is inclined in the first direction, and the direction of magnetization of the second ferromagnetic metal layer is inclined due to the inclined surface.

10 Claims, 11 Drawing Sheets

(51) Int. Cl.
*H01L 43/12* (2006.01)
*H01L 43/08* (2006.01)

(56) References Cited

U.S. PATENT DOCUMENTS

| | | | |
|---|---|---|---|
| 7,274,080 | B1 | 9/2007 | Parkin |
| 8,350,347 | B2 | 1/2013 | Gaudin et al. |
| 9,478,309 | B2 | 10/2016 | Nebashi et al. |
| 9,608,039 | B1* | 3/2017 | Apalkov ............... G11C 11/161 |
| 9,691,458 | B2 | 6/2017 | Ralph et al. |
| 10,319,901 | B2 | 6/2019 | Sasaki et al. |
| 10,797,231 | B2 | 10/2020 | Sasaki et al. |
| 2002/0145902 | A1 | 10/2002 | Kunikiyo et al. |
| 2004/0089904 | A1 | 5/2004 | Bhattacharyya et al. |
| 2008/0151614 | A1 | 6/2008 | Guo |
| 2008/0176107 | A1 | 7/2008 | Takahashi et al. |
| 2010/0073806 | A1 | 3/2010 | Koui et al. |
| 2010/0271870 | A1 | 10/2010 | Zheng et al. |
| 2011/0044099 | A1 | 2/2011 | Dieny |
| 2012/0267734 | A1 | 10/2012 | Sasaki et al. |
| 2012/0320666 | A1 | 12/2012 | Ohno et al. |
| 2013/0107395 | A1 | 5/2013 | Nagasawa et al. |
| 2014/0169088 | A1 | 6/2014 | Buhrman et al. |
| 2015/0129995 | A1* | 5/2015 | Wang ..................... G11C 11/161 257/421 |
| 2015/0348606 | A1 | 12/2015 | Buhrman et al. |
| 2016/0225424 | A1 | 8/2016 | Qiu et al. |
| 2016/0247550 | A1 | 8/2016 | Fukami et al. |
| 2016/0315249 | A1 | 10/2016 | Kardasz et al. |
| 2017/0141297 | A1* | 5/2017 | Apalkov ................ H01L 43/08 |
| 2017/0178705 | A1 | 6/2017 | Buhrman et al. |
| 2017/0222135 | A1 | 8/2017 | Fukami et al. |
| 2018/0005677 | A1 | 1/2018 | Gaudin et al. |
| 2018/0033953 | A1 | 2/2018 | Sasaki et al. |

FOREIGN PATENT DOCUMENTS

| | | |
|---|---|---|
| WO | 2016/021468 A1 | 2/2016 |
| WO | 2016/113503 A1 | 7/2016 |

OTHER PUBLICATIONS

Aug. 27, 2018 Office Action issued in U.S. Appl. No. 15/705,991.
I. M. Miron et al., "Perpendicular Switching of a Single Ferromagnetic Layer Induced By In-Plane Current Injection", Nature, vol. 476, (2011), pp. 189-194.
Y. K. Kato et al., "Observation of the Spin Hall Effect in Semiconductors" Science, vol. 306, (2004), pp. 1910-1913.
L. Liu et al., "Spin Torque Switching With the Giant Spin Hall Effect of Tantalum", Science, vol. 336, (2012), pp. 555.
L. Liu et al., "Current-Induced Switching of Perpendicularly Magnetized Magnetic Layers Using Spin Torque From the Spin Hall Effect" Physical Review Letters, vol. 109, (2012), pp. 096602-1-0096602-5.
KS. Lee et al., "Threshold Current for Switching of a Perpendicular Magnetic Layer Induced By Spin Hall Effect", Applied Physics Letters, vol. 102, (2013), pp. 112410.
KS. Lee et al., "Thermally Activated Switching of Perpendicular Magnet By Spin-Orbit Torque", Applied Physics Letters, vol. 104, (2014), p. 072413-1-072413-5.
S. Fukami et al., "Magnetization Switching By Spin-Orbit Torque in an Antiferromagnet-Ferromagnet Bilayer System", Nature Materials, vol. 15, (2016), pp. 535-542.
S. Fukami et al., "A Spin-Orbit Torque Switching Scheme With Collinear Magnetic Easy Axis and Current Configuration", Nature Technology, vol. 11, (2016), pp. 621.
S. Takahashi et al., "Spin Injection and Detection in Magnetic Nanostructures",Physical Review B, vol. 67, (2003), pp. 052409-1-052409-4.
Y. Seo et al., "Area-Efficient SOT-MRAM With a Schottky Diode", IEEE Electron Device Letters, vol. 37, No. 8, (2016), pp. 982-985.
Yu, Guoqiang et al., "Switching of perpendicular magnetization by spin-orbit torques in the absence of external magnetic fields", Nature Nanotechnology, pp. 548-554, vol. 9, (2014).
U.S. Appl. No. 15/702,290, filed Sep. 12, 2017.
U.S. Appl. No. 15/705,991, filed Sep. 15, 2017.
U.S. Appl. No. 15/642,003, filed Jul. 5, 2017.
Aug. 10, 2018 Office Action issued in U.S. Appl. No. 15/642,003.
Nov. 16, 2018 Office Action issued in U.S. Appl. No. 15/702,290.
Dec. 11, 2018 Office Action issued in U.S. Appl. No. 15/642,003.
Feb. 20, 2020 Office Action issued in U.S. Appl. No. 16/359,040.
You Long, et al., "Switching of Perpendicularly Polarized Nanomagnets with Spin Orbit Torque Without an External Magnetic Field by Engineering a Tilted Anisotropy," Proceedings of the National Academy of Sciences of the United States of America, Aug. 18, 2015, vol. 112, No. 33, pp. 10310-10315.
Jul. 22, 2021 Office Action issued in U.S. Appl. No. 17/010,329.

* cited by examiner

SPIN CURRENT MAGNETIZATION REVERSAL ELEMENT, ELEMENT ASSEMBLY, AND METHOD FOR PRODUCING SPIN CURRENT MAGNETIZATION REVERSAL ELEMENT

This is a Divisional Application of U.S. patent application Ser. No. 15/642,003 filed Jul. 5, 2017. The present invention relates to a spin current magnetization reversal element, an element assembly, and a method for producing a spin current magnetization reversal element. Priority is claimed on Japanese Patent Application No. 2016-149413, filed Jul. 29, 2016, and Japanese Patent Application No. 2017-98340, filed May 17, 2017, the contents of which are incorporated herein by reference.

BACKGROUND OF THE INVENTION

Technical Field

Background Art

Examples of known magnetoresistance effect elements include giant magnetoresistance (GMR) elements composed of a multilayer film of ferromagnetic layers and non-magnetic layers, and tunnel magnetoresistance (TMR) elements which use insulating layers (tunnel barrier layers, barrier layers) for the non-magnetic layers. Generally, TMR elements have a larger element resistance than GMR elements, but the magnetoresistance (MR) ratio is larger than GMR elements. Consequently, TMR elements are attracting much attention as elements for magnetic sensors, high-frequency components, magnetic heads and non-volatile random access memory (MRAM).

MRAM reads and writes data by utilizing the characteristic that when the relative orientation between the magnetizations of two ferromagnetic layers that sandwich an insulating layer is changed, the element resistance of the TMR element changes. Examples of known methods for writing to MRAM include a method in which a magnetic field generated by an electric current is used to perform writing (magnetization reversal), and a method in which a spin transfer torque (STT) generated by passing an electric current through the stacking direction of a magnetoresistance effect element is used to perform writing (magnetization reversal).

Magnetization reversal of a TMR element using STT is efficient if considered form the viewpoint of energy efficiency, but the reversal current density required to achieve magnetization reversal is high. From the viewpoint of achieving a long life for the TMR element, this reversal current density is preferably low. This point is similar for GMR elements.

Accordingly, in recent years, much attention has been focused on magnetization reversal that utilizes pure spin current generated by spin-orbit interaction as a technique for reducing the reversal current (for example, see Patent Document 1). Pure spin current generated by spin-orbit interaction induces spin-orbit torque (SOT), with this SOT causing magnetization reversal. Further, pure spin current generated by the Rashba effect at the interface between different materials can also cause magnetization reversal by SOT in a similar manner. Details regarding the mechanisms of these processes are still not entirely clear. A pure spin current is generated when an electron with upward spin and an electron with downward spin flow with the same frequency in opposing directions, so that the electric charge flows cancel each other out. As a result, the electric current flowing in the magnetoresistance effect element is zero, meaning that using spin-orbit torque (SOT) is expected to e then the lifespan of the magnetoresistance effect element.

On the other hand, with magnetization reversal using SOT, it is said that the symmetry of the magnetization undergoing magnetization reversal must be broken by applying an external magnetic field (for example, see Non-Patent Document 2). Application of an external magnetic field requires a magnetic field source. However, provision of a separate magnetic field source leads to a reduction in the degree of integration of the integrated circuit containing the spin current magnetization reversal element. Accordingly, techniques for enabling magnetization reversal using SOT without requiring application of an external magnetic field are being actively sought.

For example, Patent Document 1 and Non-Patent Document 3 disclose that altering the oxygen content of the oxide film joined to the ferromagnetic material that undergoes magnetization reversal breaks the symmetry of the magnetization strength. When the symmetry of the magnetization strength is broken, magnetization rotation becomes easier, and magnetization reversal using SOT becomes possible even in the absence of a magnetic field.

PRIOR ART LITERATURE

Patent Document

Patent Document 1: U.S. Patent Application No. 2015/0129995

Non-Patent Documents

Non-Patent Document 1: I. M. Miron, K. Garello, G. Gaudin, P. -J. Zermatten, M. V. Costache, S. Auffret, S. Bandiera, B. Rodmacq, A. Schuhl, and P. Gambardella, Nature, 476, 189 (2011)

Non-Patent Document 2: S. Fukami, T. Anekawa, C. Zhang, and H. Ohno, Nature Nanotechnology, DOI:10.1038/NNANO.2016.29

Non-Patent Document 3: Guoqiang Yu, et al., Nature Nanotechnology, DOI:10.1038/NNANO.2014.94

SUMMARY OF THE INVENTION

Technical Problem

However, in the methods disclosed in Patent Document 1 and Non-Patent Document 3, control of the oxygen content is difficult. In particular, in elements fabricated by thin-film processes, forming the same oxide content gradient in mass production has proven difficult. Further, if the size of the magnetic anisotropy within the in-plane direction of the magnetoresistance effect element differs, then when an unintentional external force (such as an external magnetic field or heat) is applied, the magnetization of portions having less magnetic anisotropy may sometimes reverse. Unintentional magnetization reversal becomes data noise, which can impair the long-term storage of data. Particularly in those cases where the size of the ferromagnetic material of the magnetoresistance effect element is a size capable of forming a magnetic domain wall, there is a possibility that magnetization reversal of those portions having less magnetic anisotropy may induce magnetization reversal of other portions, leading to the overwriting of data.

The present invention has been developed in light of the above issues, and has an object of providing a spin current magnetization reversal element that can undergo magnetization reversal without application of an external magnetic field.

Solution to Problem

The inventors of the present invention generated an inclination in the magnetization, by inclining at least one surface of the ferromagnetic material that is to undergo magnetization reversal, thereby generating a state similar to the state achieved when an external magnetic field is applied. Further, by bringing the initial state of magnetization rotation closer to the state when an external magnetic field is applied, magnetization reversal by SOT was able to be achieved without applying an external magnetic field. In other words, in order to achieve the above object, the present invention provides the aspects described below.

(1) A spin current magnetization reversal element according to a first aspect includes a magnetoresistance effect element having a first ferromagnetic metal layer having a fixed magnetization direction, a second ferromagnetic metal layer having a variable magnetization direction, and a non-magnetic layer sandwiched between the first ferromagnetic metal layer and the second ferromagnetic metal layer, and spin-orbit torque wiring which extends in a first direction that intersects the stacking direction of the magnetoresistance effect element, and contacts the surface of the magnetoresistance effect element on the side facing the second ferromagnetic metal layer, wherein at least one surface of the second ferromagnetic metal layer in the stacking direction has an inclined surface that is inclined in the first direction, and the direction of magnetization of the second ferromagnetic metal layer is inclined due to the inclined surface.

(2) In the spin current magnetization reversal element according to the aspect described above, the surface of the spin-orbit torque wiring on the side facing the magnetoresistance effect element may have an inclined surface that is inclined in the first direction.

(3) In the spin current magnetization reversal element according to the aspect described above, both surfaces of the second ferromagnetic metal layer may have inclined surfaces that are inclined in the first direction.

(4) In the spin current magnetization reversal element according to the aspect described above, the inclined surface of the second ferromagnetic metal layer on the side facing the spin-orbit torque wiring and the inclined surface on the side facing the non-magnetic layer may be parallel.

(5) In the spin current magnetization reversal element according to the aspect described above, the inclined surface may also be inclined in a second direction that intersects the stacking direction and the first direction.

(6) In the spin current magnetization reversal element according to the aspect described above, the surface of the second ferromagnetic metal layer having the inclined surface may have a first inclined surface and a second inclined surface with different positive and negative inclination angles relative to a reference plane, wherein the surface area of the first inclined surface is greater than the surface area of the second inclined surface.

(7) A spin current magnetization reversal element according to a second aspect includes a ferromagnetic metal layer, and spin-orbit torque wiring which extends in a first direction that intersects the stacking direction of the ferromagnetic metal layer, and contacts one surface of the ferromagnetic metal layer, wherein at least one surface of the ferromagnetic metal layer in the stacking direction has an inclined surface that is inclined in the first direction.

(8) An element assembly according to a third aspect contains a plurality of spin current magnetization reversal elements according to one of aspects described above.

(9) In the element assembly according to the aspect described above, the inclined surfaces of the plurality of spin current magnetization reversal elements may be inclined in the same direction.

(10) A method for producing a spin current magnetization reversal element according to a fourth aspect has a stacking step of stacking a magnetoresistance effect element having a first ferromagnetic metal layer having a fixed magnetization direction, a second ferromagnetic metal layer having a variable magnetization direction and a non-magnetic layer sandwiched between the first ferromagnetic metal layer and the second ferromagnetic metal layer, and spin-orbit torque wiring which extends in a first direction, wherein either before or during the stacking step, an inclined surface that is inclined in the first direction is formed on at least one surface of the second ferromagnetic metal layer.

(11) In the method for prod a spin current magnetization reversal element according to the aspect described above, the inclined surface may be formed by polishing along the first direction.

(12) In the method for producing a spin current magnetization reversal element according to the aspect described above, the inclined surface may be formed by anisotropic etching along the first direction.

(13) In the method for producing a spin current magnetization reversal element according to the aspect described above, the inclined surface may be formed by anisotropic deposition along the first direction.

(14) A method for producing a spin current magnetization reversal element according to a fifth aspect has a stacking step of stacking a ferromagnetic metal layer and spin-orbit torque wiring which extends in a first direction, wherein either before or during the stacking step, an inclined surface that is inclined in the first direction is formed on at least one surface of the ferromagnetic metal layer.

Effects of the Invention

By using the spin current magnetization reversal element according to an aspect described above, magnetization reversal can be achieved without applying an external magnetic field.

DETAILED DESCRIPTION

The present invention is described below in further detail, with reference to the drawings. The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the scope of the present invention.

First Embodiment

Figure 1:
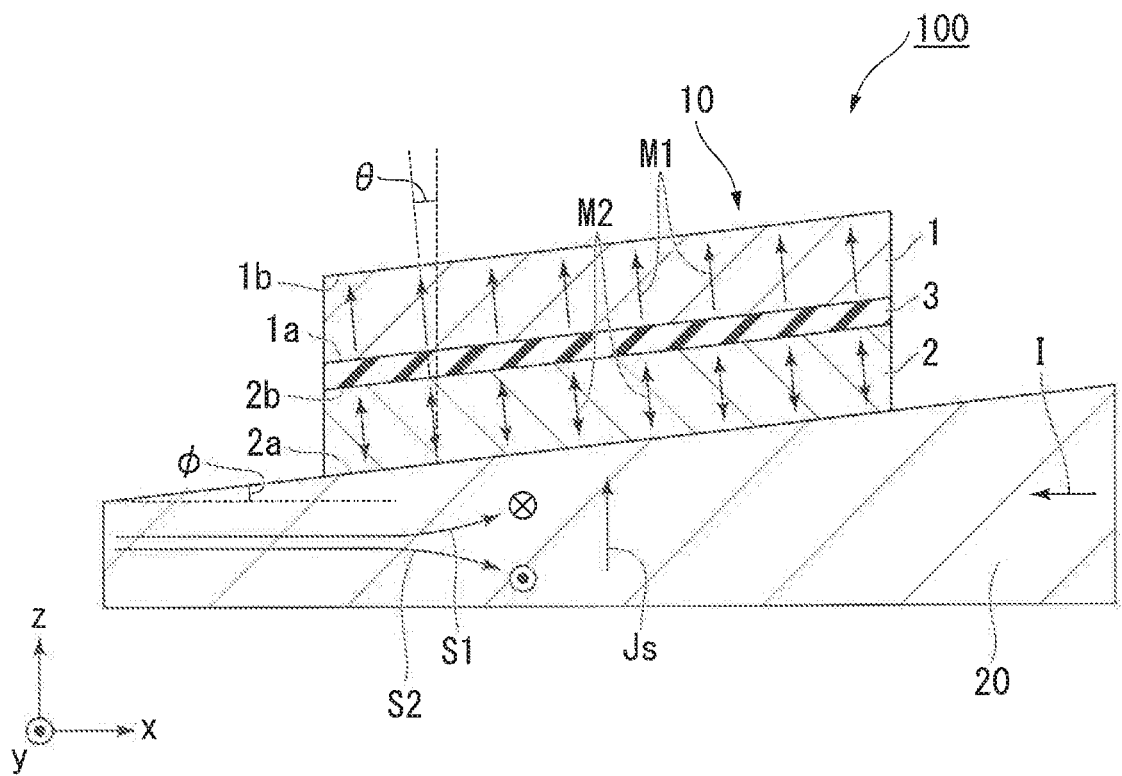
FIG. 1 is a diagram schematically illustrating a cross section of a spin current magnetization reversal element according to a first embodiment.

FIG. 1 is a cross sectional view schematically illustrating a spin current magnetization reversal element according to a first embodiment.

The spin current magnetization reversal element 100 according to the first embodiment has a magnetoresistance effect element 10 and spin-orbit torque wiring 20.

In the following description, a first direction along which the spin-orbit torque wiring 20 extends is deemed the x-direction, a second direction which represents an in-plane direction of the extension of the spin-orbit torque wiring 20 that is orthogonal to the first direction is deemed the y-direction, and the stacking direction of the magnetoresistance effect element 10 which is orthogonal to both the x-direction and the y-direction is deemed the z-direction.

<Magnetoresistance Effect Element>

The magnetoresistance effect element 10 has a first ferromagnetic metal layer 1 having a fixed magnetization direction, a second ferromagnetic metal layer 2 having a variable magnetization direction, and a non-magnetic layer 3 sandwiched between the first ferromagnetic metal layer 1 and the second ferromagnetic metal layer 2.

The magnetoresistance effect element 10 functions by having the magnetization M1 of the first ferromagnetic metal layer 1 fixed in a single direction, whereas the orientation of the magnetization M2 of the second ferromagnetic metal layer 2 is able to vary relatively. When applied to coercive force difference (pseudo spin valve) MRAM, the coercive force of the first ferromagnetic metal layer is larger than the coercive force of the second ferromagnetic metal layer, and when applied to exchange bias (spin valve) MRAM, the magnetization direction of the first ferromagnetic metal layer is fixed by exchange coupling with an antiferromagnetic layer.

Further, when the non-magnetic layer 3 is formed from an insulator, the magnetoresistance effect element 10 is a tunneling magnetoresistance (TMR) element, whereas when the non-magnetic layer 3 is formed from a metal, the magnetoresistance effect element 10 is a giant magnetoresistance (GMR) element.

The stacking structure of the magnetoresistance effect element can employ a conventional magnetoresistance effect element stacking structure. For example, each layer may be composed of a plurality of layers, and the structure may also include other layers such as an antiferromagnetic layer for fixing the magnetization direction of the first ferromagnetic metal layer 1. The first ferromagnetic metal layer 1 is also called the fixed layer or reference layer, whereas the second ferromagnetic metal layer 2 is also called the free layer or the memory layer.

In the magnetoresistance effect element 10 according to the first embodiment, the surface of the second ferromagnetic metal layer 2 on the side facing the spin-orbit torque wiring 20 is inclined in the x-direction, forming an inclined surface 2a. Further, the surface of the second ferromagnetic metal layer 2 on the side facing the non-magnetic layer 3 is also inclined in the x-direction, forming an inclined surface 2b.

The magnetization M2 of the second ferromagnetic metal layer 2 is greatly affected by the stacking interface. Generally, in the case of a perpendicular magnetization film, the magnetization is oriented perpendicularly to the stacking interface. The magnetization M2 of the second ferromagnetic metal layer 2 illustrated in FIG. 1 is affected by the inclined surface 2a and the inclined surface 2b, and is inclined from the z-direction by an inclination angle θ toward the x-direction.

In FIG. 1, the inclined surface 2a and the inclined surface 2b are parallel. As a result, the inclination angle θ of the magnetization M2 of the second ferromagnetic metal layer 2 is equal at any location in the xy-plane. In this case, the inclination angle θ of the magnetic M2 is equal to the inclination angle ø of the inclined surface 2a.

Further, because the inclined surface 2a and the inclined surface 2b are parallel, the second ferromagnetic metal layer 2 has the same thickness at any location in the xy-plane. Here, the "thickness of the second ferromagnetic metal layer 2" means the length of a perpendicular line from the inclined surface 2a to the inclined surface 2b. Further, the expression "the same" means that the thickness does not vary by ±10% or more relative to the Mean value of the thickness values for the second ferromagnetic metal layer 2 measured at 10 random points in the xy-plane.

Provided the thickness of the second ferromagnetic metal layer 2 and the inclination angle θ of the magnetization M2 are both constant within the xy-plane, the size of the magnetization M2 of the second ferromagnetic metal layer 2 will also be constant within the xy-plane. Provided the size of the magnetization M2 of the second ferromagnetic metal layer is constant within the in-plane direction, the problem wherein the magnetization of portions having less magnetic anisotropy may unintentionally reverse can be avoided. Unintentional magnetization reversal becomes data noise, which can impair the long-term storage of data. Particularly in those cases where the size of the second ferromagnetic metal layer 2 is a size capable of forming a magnetic domain wall, there is a possibility that magnetization reversal of portions having less magnetic anisotropy may induce magnetization reversal of other portions, leading to the overwriting of data.

The non-magnetic layer 3 and the first ferromagnetic metal layer 1 are stacked on top of the second ferromagnetic metal layer 2, and are inclined in the x-direction. As a result, an inclined surface 1a is formed on the surface of the first ferromagnetic metal layer 1 on the side facing the non-magnetic layer 3, and an inclined surface 1b is formed on the surface on the opposite side.

The magnetization M1 of the first ferromagnetic metal layer 1 is affected by the inclined surface 1a and the inclined surface 1b, and is inclined in the x-direction. The inclination angle of the magnetization M1 is equal to the inclination angle of the magnetization M2.

In FIG. 1, the inclined surface 1a and the inclined surface 1b are parallel. As a result, the thickness of the first ferromagnetic metal layer 1 is the same at any location in the xy-plane. In other words, the magnetization M1 of the first ferromagnetic metal layer 1 has the same influence on the magnetization M2 of the second ferromagnetic metal layer 2 at any location in the xy-plane. Accordingly, the stability of the magnetization M2 of the second ferromagnetic metal layer 2 is enhanced.

Further, provided the inclined surface 2b of the second ferromagnetic metal layer 2 and the inclined surface 1a of the first ferromagnetic metal layer 1 are parallel, the thickness of the non-magnetic layer 3 will also be the constant within the xy-plane. Provided the thickness of the non-magnetic layer 3 is constant within the xy-plane, the contribution of the magnetization M1 of the first ferromagnetic metal layer 1 to the magnetization M2 of the second ferromagnetic metal layer 2 is constant, and the stability of the magnetization M2 of the second ferromagnetic metal layer 2 is enhanced.

Conventional materials can be used as the material for the first ferromagnetic metal layer 1. For example, metals selected from the group consisting of Cr, Mn, Co, Fe and Ni, and alloys containing at least one of these metals and having ferromagnetism can be used. Further, alloys containing at least one of these metals and at least one element among B, C and N can also be used. Specific examples include Co—Fe and Co—Fe—B.

Further, in order to achieve higher output, a Heusler alloy such as $Co_2FeSi$ is preferably used, Hensler alloys contain intermetallic compounds having a chemical composition of $X_2YZ$, wherein X is a noble metal element or a transition metal element belonging to the Co, Fe, Ni or Cu group of the periodic table, whereas Y is a transition metal belonging to the Mn, V, Cr or Ti group of the periodic table, and can select the elemental species of X, and Z is a typical element of group III to group V. Specific examples include $Co_2FeSi$, $Co_2MnSi$, and $Co_2Mn_{1-a}Fe_aAl_bSi_{1-b}$.

Furthermore, in order to increase the coercive force of the first ferromagnetic metal layer 1 on the second ferromagnetic metal layer 2, an antiferromagnetic material such as IrMn or PtMn may be used as the material that contacts the first ferromagnetic metal layer 1. Moreover, in order to ensure that the leakage magnetic field of the first ferromagnetic metal layer 1 does not affect the second ferromagnetic metal layer 2, a structure having synthetic ferromagnetic coupling may be used.

Furthermore, in those cases where the orientation of the magnetization of the first ferromagnetic metal layer 1 is perpendicular to the stacking surface, a stacked film of Co and Pt is preferably used. Specifically, the structure of the first ferromagnetic metal layer 1 may be [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

For the material of the second ferromagnetic metal layer 2, a ferromagnetic material, and particularly a soft magnetic material, can be used. Examples of materials that can be used include metals selected from the group consisting of Cr, Mn, Co, Fe and Ni, alloys containing at least one of these metals, and alloys containing at least one of these metals and at least one element among B, C and N. Specific examples include Co—Fe, Co—Fe—B and Ni—Fe.

In those cases where the orientation of the magnetization of the second ferromagnetic metal layer 2 is perpendicular to the stacking surface, the thickness of the second ferromagnetic metal layer 2 is preferably not more than 2.5 nm. Perpendicular magnetic anisotropy can be applied to the second ferromagnetic metal layer 2 at the interface between the second ferromagnetic metal layer 2 and the non-magnetic layer 3. Further, because the perpendicular magnetic anisotropy effect is attenuated as the thickness of the second ferromagnetic metal layer 2 is increased, the thickness of the second ferromagnetic metal layer 2 is preferably kept thin.

Conventional materials can be used as the non-magnetic layer 3.

For example, when the non-magnetic layer 3 is formed from an insulator (and forms a tunnel barrier layer), examples of materials that can be used include $Al_2O_3$, $SiO_2$, MgO and $MgAl_2O_4$. In addition to these materials, materials in which a portion of the Al, Si or Mg has been substituted with Zn or Be or the like can also be used. Among the above materials, MgO and $MgAl_2O_4$ are materials that enable the realization of coherent tunneling, and therefore enable efficient injection of spin.

Further, when the non-magnetic layer 3 is formed from a metal, examples of materials that can be used include Cu, Au, and Ag and the like.

Furthermore, the magnetoresistance effect element 10 may also have other layers. For example, the magnetoresistance effect element 10 may have a base layer on the opposite surface of the second ferromagnetic metal layer 2 from the non-magnetic layer 3, and/or may have a capping layer on the opposite surface of the first ferromagnetic metal layer 1 from the non-magnetic layer 3.

A layer disposed between the spin-orbit torque wiring 20 and the magnetoresistance effect element 10 preferably does not dissipate the spin propagated from the spin-orbit torque wiring 20. For example, silver, copper, magnesium, and aluminum and the like have a long spin diffusion length of at least 100 nm, and are known to be resistant to spin dissipation.

The thickness of this layer is preferably not more than the spin diffusion length of the material used for forming the layer. Provided the thickness of the layer is not more than the spin diffusion length, the spin propagated from the spin-orbit torque wiring 20 can be transmitted satisfactorily to the magnetoresistance effect element 10.

<Spin-Orbit Torque Wiring>

The spin-orbit torque wiring 20 extends along the x-direction. The spin-orbit torque wiring 20 is connected to one surface of the second ferromagnetic metal layer 2 in the z-direction. The spin-orbit torque wiring 20 may be connected directly to the second ferromagnetic metal layer 2, or connected via another layer.

The spin-orbit torque wiring 20 illustrated in FIG. 1 has a structure in which the surface on the side facing the magnetoresistance effect element 10 is inclined in the x-direction. Each layer of the magnetoresistance effect element 10 is stacked in an arrangement that reflects the shape of this inclined surface of the spin-orbit torque wiring 20.

The spin-orbit torque wiring 20 is formed from a material that generates a pure spin current by the spin Hall effect when a current flows through the material. This material may have any composition capable of generating a pure spin current in the spin-orbit torque wiring 20. Accordingly, the material is not limited to materials formed from simple elements, and may also be composed of a portion formed from a material that generates a pure spin current and a portion formed from a material that does not generate a pure spin current.

The spin Hall effect is a phenomenon wherein when an electric current is passed through a material, a pure spin current is induced in a direction orthogonal to the orientation of the electric current as a result of spin-orbit interactions. The mechanism by which a pure spin current is generated by the spin Hall effect is described below based on FIG. 1.

As illustrated in FIG. 1, when a potential difference is applied between the two ends of the spin-orbit torque wiring 20 in the x-direction, an electric current I flows along the x-direction. When this current I flows, a first spin S1 oriented toward the back of the paper surface and a second spin S2 oriented toward the front of the paper surface are bent in directions orthogonal to the current. The normal Hall effed and the spin Hall effect have in common the fact that the direction of travel (movement) of the traveling (moving) electric charge (electrons) is bent, but differ significantly in terms of the fact that in the common effect, charged particles moving through a magnetic field are affected by Lorentz forces, resulting in bending of the travel direction, whereas in the spin Hall effect, despite no magnetic field existing, the travel direction bends simply under the effect of the movement of the electrons (flow of current).

In a non-magnetic material (a material that is not ferromagnetic), the electron count of the first spin S1 and the electron count of the second spin S2 are equal, and therefore in FIG. 1, the electron count of the first spin S1 moved to the upward direction and the electron count of the second spin S2 moved to the downward direction are equal. Accordingly, the electric current represented by the net flux of the electric charge is zero. This type of spin current that is accompanied by no electric current is called a pure spin current.

When a current is passed through a ferromagnetic material, the fact that the first spin S1 and the second spin S2 are bent in opposite directions is the same. However, the difference in a ferromagnetic material is that one of either the first spin S1 or the second spin S2 is greater, resulting in the occurrence of a net flux for the electric charge (and the generation of a voltage). Accordingly, a material formed solely from a ferromagnetic substance cannot be used as the material for the spin-orbit torque wiring 20.

If the electron flow of the first spin S1 is represented by $J_\uparrow$, the electron flow of the second spin S2 is represented by $J_\downarrow$, and the spin current is represented by $J_S$, then the spin current is defined as $J_S=J_\uparrow-J_\downarrow$. In FIG. 1, the pure spin current $J_S$ flows in the upward direction in the figure. Here, $J_S$ is an electron flow having 100% polarizability.

In FIG. 1, when a ferromagnetic material is brought into contact with the upper surface of the spin-orbit torque wiring 20, the pure spin current diffuses and flows into the ferromagnetic material. In other words, spin is injected into the magnetoresistance effect element 10.

The spin-orbit torque wiring 20 may contain a non-magnetic heavy metal. Here, the term "heavy metal" is used to mean a metal having a specific gravity at least as large as that of yttrium. The spin-orbit torque wiring 20 may also be formed solely from a non-magnetic metal.

In such a case, the non-magnetic metal is preferably a non-magnetic metal with a large atomic number, and specifically a non-magnetic metal with an atomic number of 39 or greater having d-electrons or f-electrons in the outermost shell. The reason for this preference is that such non-magnetic metals exhibit large spin-orbit interactions that generate a spin Hall effect. The spin-orbit torque wiring 20 may also be formed solely from a non-magnetic metal with a large atomic number, having an atomic number of 39 or greater and having d-electrons or f-electrons in the outermost shell.

Typically, when a current is passed through a metal, all of the electrons move in the opposite direction of the current regardless of spin orientation, but in the case of a non-magnetic metal with a large atomic number having d-electrons or f-electrons in the outermost shell, because the spin-orbit interactions are large, the spin Hall effect means that the direction of electron movement is dependent on the electron spin orientation, meaning a pure spin current $J_S$ develops more readily. When Ir is used as the non-magnetic heavy metal, the spin. Hall effect is particularly large. Moreover, a greater perpendicular magnetic anisotropy than possible with conventional materials can be imparted to the second ferromagnetic metal layer 2 at the interface between the Ir and the second ferromagnetic metal layer 2.

Furthermore, the spin-orbit torque wiring 20 may contain a magnetic metal. The term "magnetic metal" means a ferromagnetic metal or an antiferromagnetic metal. By including a trace amount of a magnetic metal in the non-magnetic metal, the spin-orbit interactions can be amplified, thereby increasing the spin current generation efficiency of the electric current passed through the spin-orbit torque wiring 20. The spin-orbit torque wiring 20 may also be formed solely from an antiferromagnetic metal.

Spin-orbit interactions occur within interior locations peculiar to the substance of the spin-orbit torque wiring material. Accordingly, pure spin currents also develop in non-magnetic materials. By adding a trace amount of a magnetic metal to the spin-orbit torque wiring material, because the electron spin of the magnetic metal itself is scattered, the efficiency of spin current generation is enhanced. However, if the amount added of the magnetic metal is too large, then the generated pure spin current tends to be scattered by the added magnetic metal, resulting in a stronger action reducing the spin current. Accordingly, it is preferable that the molar ratio of the added magnetic metal is considerably lower than that of the main component of the pure spin current generation portion in the spin-orbit torque wiring. As a guide, the molar ratio of the added magnetic metal is preferably not more than 3%.

Furthermore, the spin-orbit torque wiring may contain a topological insulator. The spin-orbit torque wiring 20 may also be formed solely from a topological insulator. A topological insulator is a substance in which the interior of the substance is an insulator or a high-resistance body, but the surface of the substance forms a metal-like state with spin polarization. Some substances have a type of internal magnetic field known as a spin-orbit interaction. Accordingly, even if an external magnetic field does not exist, the effect of these spin-orbit interactions generates a new topological phase. This is a topological insulator, which as a result of strong spin-orbit interactions and the break of inversion symmetry at the edges, is able to generate a pure spin current with good efficiency.

Examples of preferred topological insulators include SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$. These topological insulators can generate spin current with good efficiency.

The spin current magnetization reversal element 100 may also have other structural elements besides the magnetoresistance effect element 10 and the spin-orbit torque wiring 20. For example, the spin current magnetization reversal element 100 may have a substrate or the like as a support. The substrate preferably has superior smoothness, and examples of materials that can be used include Si and AlTiC.

(Principles of Spin Current Magnetization Reversal Element)

Next is a description of the principles of the spin current magnetization reversal element 100, and the principles that enable magnetization reversal to be achieved without a magnetic field by inclining the magnetization M2 of the second ferromagnetic metal layer 2 in the x-direction.

As illustrated in FIG. 1, when an electric current I is applied to the spin-orbit torque wiring 20, the first spin S1 and the second spin S2 are bent by the spin Hall effect. As a result, a pure spin current $J_S$ is generated in the z-direction.

The magnetoresistance effect element 10 is disposed in the z-direction from the spin-orbit torque wiring 20. Accordingly, spin is injected from the spin-orbit torque wiring 20 into the second ferromagnetic metal layer 2 of the magnetoresistance effect element 10. The injected spin imparts spin-orbit torque (SOT) to the magnetization M2 of the second ferromagnetic metal layer 2, thus generating magnetization reversal. Whether or not the injected spin imparts sufficient energy to induce a magnetization reversal of the magnetization M2 is the problem.

Figure 2:
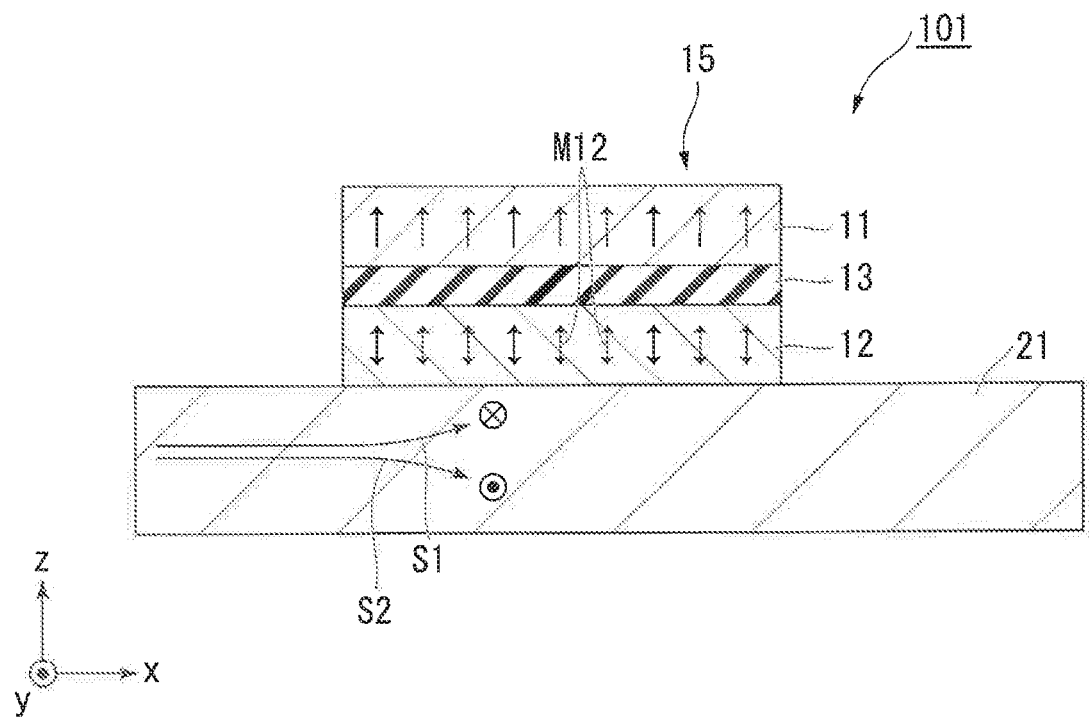
FIG. 2 is a schematic cross sectional view illustrating a spin current magnetization reversal element in which an inclined surface is not formed on either of the surfaces of the second ferromagnetic metal layer, and the magnetization of the second ferromagnetic metal layer is not inclined.

FIG. 2 is a cross sectional schematic view illustrating a spin current magnetization reversal element in which an inclined surface is not formed on either of the surfaces of the second ferromagnetic metal layer, and the magnetization of the second ferromagnetic metal layer is not inclined. In the spin current magnetization reversal element 101 illustrated in FIG. 2, the surface of spin-orbit torque wiring 21 on the side facing a magnetoresistance effect element 15 is not inclined in the x-direction. Consequently, a first ferromagnetic metal layer 11, a second ferromagnetic metal layer 12 and a non-magnetic layer 13 that constitute the magnetoresistance effect element 15 all extend within the xy-plane. As a result, the magnetization M12 of the second ferromagnetic metal layer 12 is oriented along the z-direction.

A similar structure to FIG. 2 is disclosed in FIG. 1a of Non-Patent Document 2. In Non-Patent Document 2, an external magnetic field is applied in the x-direction to reverse the magnetization M12 of the second ferromagnetic metal layer 12. This is because in order to impart the magnetization M12 with sufficient torque to cause a magnetization reversal of the magnetization M12, the symmetry of the magnetization M12 must be disturbed.

When an external magnetic held is applied, the magnetization M12 inclines in the x-direction, disturbing the symmetry of the magnetization M12. As a result, the spin injected into the magnetoresistance effect element 15 and the magnetization M12 interact, and a torque (SOT) is applied that acts as a trigger for magnetization reversal of the magnetization M12. Because the magnetization M12 undergoes magnetization reversal while precessing, if this trigger is not applied, then sufficient energy to cause magnetization reversal of the magnetization M12 cannot be applied.

In contrast, in the spin current magnetization reversal element 100 according to the first embodiment (see FIG. 1), the magnetization M2 is inclined in the x-direction by an inclination angle θ due to the inclined surface 2a and the inclined surface 2b of the second ferromagnetic metal layer 2. In other words, even in a state where no external magnetic field is applied, the symmetry of the magnetization M2 is disturbed. As a result, the magnetization M2 interacts with the spin injected into the magnetoresistance effect element 10, and can receive the torque (SOT) that acts as a trigger for magnetization reversal.

As described above, by using the spin current magnetization reversal element 100 according to the first embodiment, the magnetization M2 of the second ferromagnetic metal layer 2 (the free layer) of the magnetoresistance effect element 10 can be reversed without applying an external force such as an external magnetic field. This is because the magnetization M2 is inclined in the x-direction in accordance with the shape anisotropy, generating a "symmetry break" in the magnetoresistance effect element 10.

The present embodiment is not necessarily limited to the structure described above, and various modifications are possible without departing from the object of the embodiment.

Figure 3A:
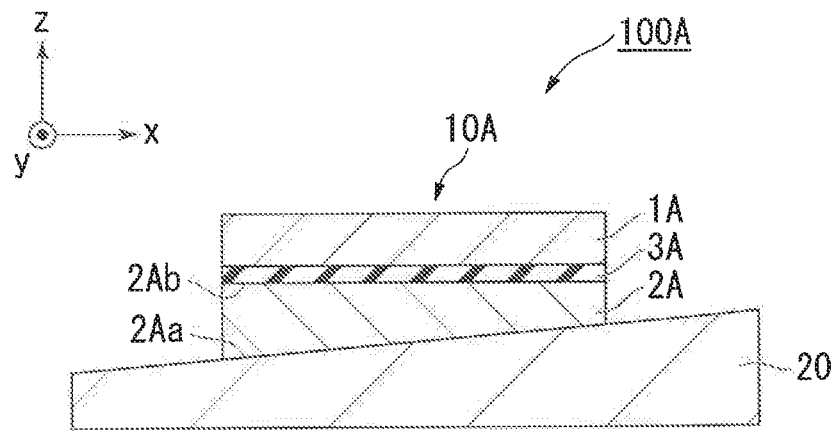
FIG. 3A is a series of diagrams schematically illustrating cross sections of other examples of spin current magnetization reversal elements according to the first embodiment.
Figure 3B:
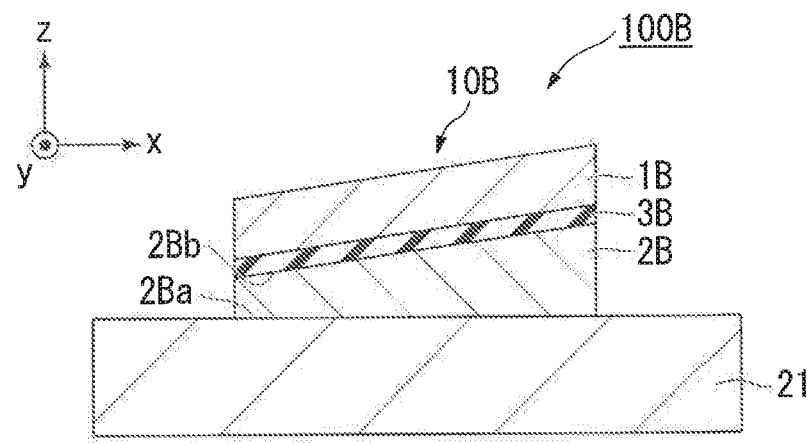
FIG. 3B is a series of diagrams schematically illustrating cross sections of other examples of spin current magnetization reversal elements according to the first embodiment.
Figure 3C:
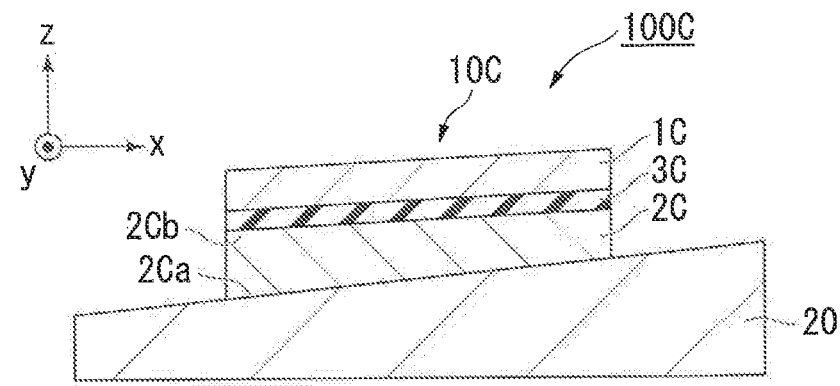
FIG. 3C is a series of diagrams schematically illustrating cross sections of other examples of spin current magnetization reversal elements according to the first embodiment.

FIGS. 3A to 3C are a series of diagrams schematically illustrating cross sections of other examples of spin current magnetization reversal elements according to the first embodiment.

A spin current magnetization reversal element 100A illustrated in FIG. 3A differs from the spin current magnetization reversal element 100 illustrated in FIG. 1 in that an inclined surface is provided only on a first surface 2Aa of a second ferromagnetic metal layer 2A on the side facing the spin-orbit torque wiring 20.

In the spin current magnetization reversal element 100A illustrated in FIG. 3A, the magnetoresistance effect element 10A is stacked on the spin-orbit torque wiring 20. The structure of the spin-orbit torque wiring 20 is the same as that of the spin current magnetization reversal element 100 illustrated in FIG. 1.

The magnetoresistance effect element 10A has a first ferromagnetic metal layer 1A, a second ferromagnetic metal layer 2A and a non-magnetic layer 3A, wherein the first surface 2Aa of the second ferromagnetic metal layer 2A on the side facing the spin-orbit torque wiring 20 is inclined, but the opposing second surface 2Ab is not inclined.

Further, a spin current magnetization reversal element 100B illustrated in FIG. 3B differs from the spin current magnetization reversal element 100 illustrated in FIG. 1 in that an inclined surface is provided only on a second surface 2Bb of a second ferromagnetic metal layer 2B on the opposite side from spin-orbit torque wiring 21.

In the spin current magnetization reversal element 100B illustrated in FIG. 3B, a magnetoresistance effect element 10B is stacked on the spin-orbit torque wiring 21. The structure of the spin-orbit torque wiring 21 differs from the shape of the spin current magnetization reversal element 100 illustrated in FIG. 1 in that the surface of the wiring on the side facing the magnetoresistance effect element 10B is not inclined.

The magnetoresistance effect element 10B has a first ferromagnetic metal layer 1B, a second ferromagnetic metal layer 2B and a non-magnetic layer 3B, wherein the first surface 2Ba of the second ferromagnetic metal layer 2B on the side facing the spin-orbit torque wiring 21 is not inclined, but the opposing second surface 2Bb is inclined.

Furthermore, in a spin current magnetization reversal element 100C illustrated in FIG. 3C, although inclined surfaces are provided on both surfaces of a second ferromagnetic metal layer 2C, the inclination angles of a first surface 2Ca on the side facing the spin-orbit torque wiring 20 and the opposing second surface 2Cb are different.

In the spin current magnetization reversal element 100C illustrated in FIG. 3C, a magnetoresistance effect element 10C is stacked on the spin-orbit torque wiring 20. The structure of the spin-orbit torque wiring 20 is the same as that of the spin current magnetization reversal element 100 illustrated in FIG. 1.

The magnetoresistance effect element 10C has a first ferromagnetic metal layer 1C, a second ferromagnetic metal layer 2C and a non-magnetic layer 3C, wherein both the first surface 2Ca of the second ferromagnetic metal layer 2C on the side facing the spin-orbit torque wiring 20 and the opposing second surface 2Cb are inclined. However, the inclination angles of the first surface 2Ca and the second surface 2Cb differ.

In each of the structures illustrated in FIG. 3A to FIG. 3C, the magnetization of the second ferromagnetic metal layer is inclined in the x-direction due to the effect of the inclined surface(s). Accordingly, the spin current magnetization reversal elements illustrated in FIG. 3A to FIG. 3C can each undergo magnetization reversal even in the absence of a magnetic field.

On the other hand, because the direction of orientation of the magnetization is not the same in the first ferromagnetic metal layer and the second ferromagnetic metal layer, the MR ratio is smaller than the magnetoresistance effect element 10 illustrated in FIG. 1. Further, because the thickness of the second ferromagnetic metal layer varies, the size of the magnetization of the second ferromagnetic metal layer differs depending on the location in the xy-plane. As a result, the stability of the magnetization of the second ferromagnetic metal layer deteriorates compared with that of the structure of FIG. 1.

Figure 4A:
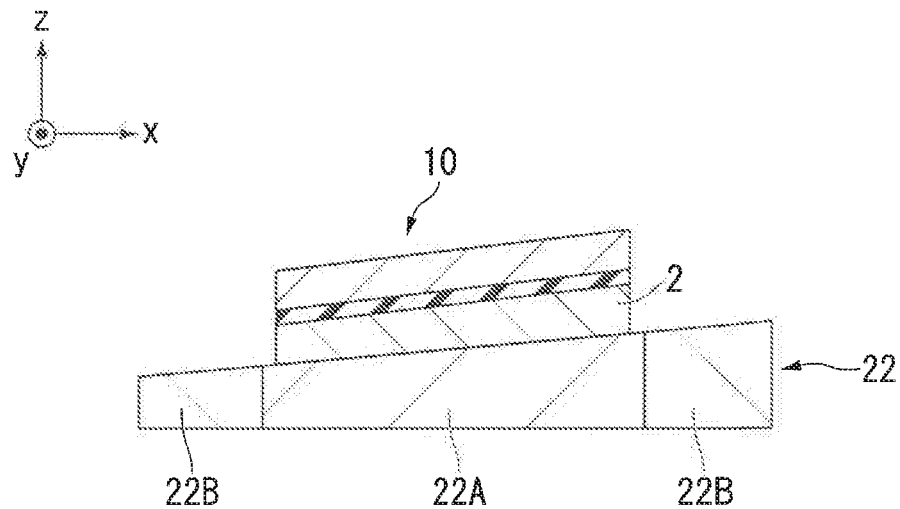
FIG. 4A is a series of diagrams schematically illustrating cross sections of other examples of spin current magnetization reversal elements according to the first embodiment.
Figure 4B:
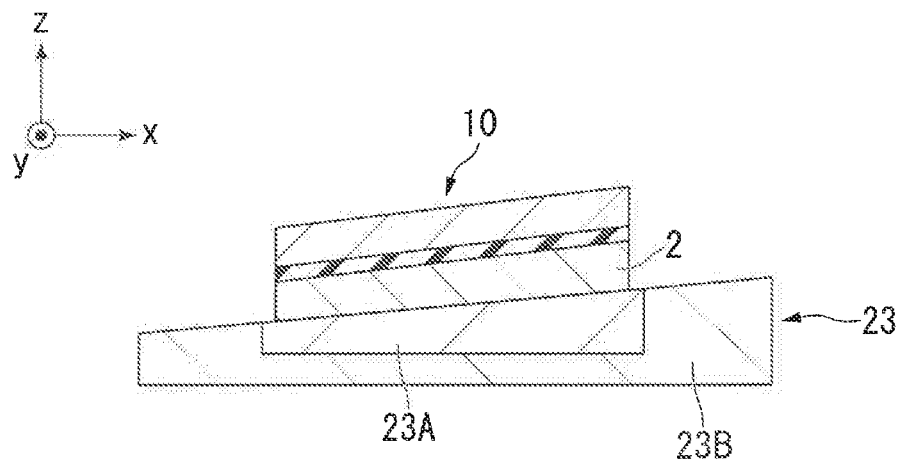
FIG. 4B is a series of diagrams schematically illustrating cross sections of other examples of spin current magnetization reversal elements according to the first embodiment.
Figure 4C:
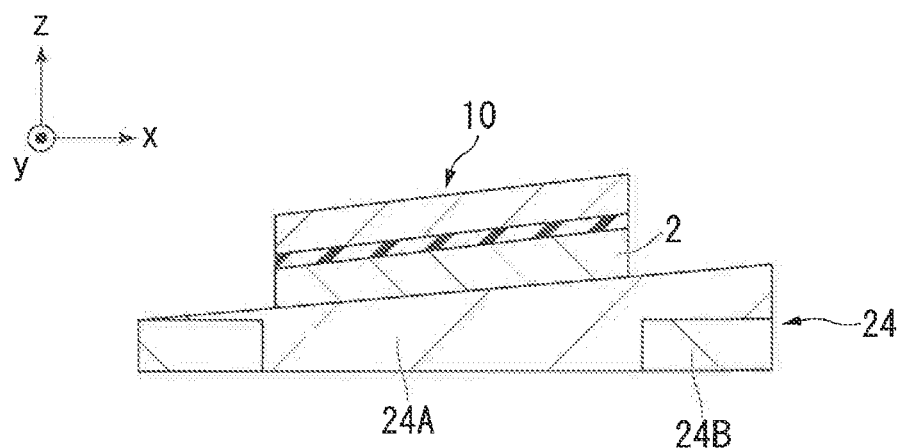
FIG. 4C is a series of diagrams schematically illustrating cross sections of other examples of spin current magnetization reversal elements according to the first embodiment.

Further, in addition to the above, the structure of the spin-orbit torque wiring may also be altered. FIGS. 4A to 4C are a series of diagrams schematically illustrating cross section f other examples of spin current magnetization reversal elements according to the first embodiment.

In each of the spin current magnetization reversal elements illustrated in FIG. 4A to FIG. 4C, the spin-orbit torque wiring has a portion formed from a material that generates a pure spin current (the spin current generation portion 22A, 23A or 24A), and a portion formed from a material having a smaller electric resistance than this spin current generation portion (the low-resistance portion 22B, 23B or 24B).

The heavy metal of the material that can generate a pure spin current has a greater electric resistance and generates a larger amount of Joule heat than the types of metals typically used as wiring. Accordingly, by providing a low-resistance portion having lower electric resistance, heat generation by the spin current magnetization reversal element can be suppressed.

The spin current generation portion may be formed from any material capable of generating a pure spin current, and may, for example, have a structure composed of portions of a plurality of different materials. Specifically, the types of materials used for the aforementioned spin-orbit torque wiring 20 can be used.

For the low-resistance portion, the types of materials typically used as wiring can be used. For example, aluminum, silver, copper, or gold or the like can be used. The low-resistance portion may be formed from any material having a lower electric resistance than the spin current generation portion, and may have a structure composed of portions of a plurality of different materials.

A pure spin current may also be generated in the low-resistance portion. In this case, the distinction between the spin current generating portion and the low resistance portion can be made from the material used as the spin current generating portion or the low resistance portion. For example, the part made of the material described in this specification can be distinguished as a spin current generation portion or a low resistance portion. Further, it is possible to distinguish a portion having lower resistance than the main portion (spin current generation portion) that generates the spin current as the low resistance portion.

The spin-orbit torque wiring 22 of the spin current magnetization reversal element illustrated in FIG. 4A has a structure in which the portion of the wiring that contacts the second ferromagnetic metal layer 2 is formed solely from a spin current generation portion 22A, and this spin current generation portion 22A is sandwiched between low-resistance portions 22B. When viewed in plan view from the stacking direction of the magnetoresistance effect element 10, the spin current generation portion 22A overlaps a region that includes the joint portion with the second ferromagnetic metal layer. In this overlapping portion, the entire thickness direction of the spin-orbit torque wiring 22 is formed solely from the spin current generation portion 22A.

The spin-orbit torque wiring 23 of the spin current magnetization reversal element illustrated in FIG. 4B has a structure in which the portion of the wiring that contacts the second ferromagnetic metal layer 2 is formed solely from a spin current generation portion 23A, and this spin current generation portion 23A is surrounded by a low-resistance portion 23B. When viewed in plan view from the stacking direction of the magnetoresistance effect element 10, the spin current generation portion 23A overlaps a region that includes the joint portion with the second ferromagnetic metal layer 2. In this overlapping portion, through the thickness direction of the spin-orbit torque wiring 23, the portion on the side facing the magnetoresistance effect element 10 is formed from the spin current generation portion 23A, and the opposite side is formed from the low-resistance portion 23B.

In the overlapping portion, the spin current generation portion and the low-resistance portion are arranged electrically in parallel. In this case, the current flowing through the spin-orbit torque wiring splits, and flows through the spin current generation portion and the low-resistance portion in proportions inversely proportional to the size of the resistance of each portion. Accordingly, the proportion of the current flowing through the spin-orbit torque wiring 23 that contributes to generation of the pure spin current decreases, and the efficiency of pure spin current generation decreases. On the other hand, the generation of Joule heat can be suppressed.

In the spin-orbit torque wiring 24 of the spin current magnetization reversal element illustrated in FIG. 4C, a spin current generation portion 24A is provided which extends along the entire surface on the side facing the magnetoresistance effect element 10, and forms the entire thickness direction of the spin-orbit torque wiring 24 in an overlapping portion that overlaps the magnetoresistance effect element 10 when viewed in plan view from the stacking direction of the magnetoresistance effect element 10. A low-resistance portion 24B sandwiches a portion of this overlapping portion.

In the structure illustrated in FIG. 4C, because the surface area of the contact between the spin current generation portion 24A and the low-resistance portion 24B is large, the adhesion between the non-magnetic metal having a high atomic number that constitutes the spin current generation portion 24A and the metal that constitutes the low-resistance portion 24B is excellent.

Further, the spin current magnetization reversal element need not necessarily have a magnetoresistance effect element containing a first ferromagnetic metal layer, a non-magnetic layer and a second ferromagnetic metal layer stacked in that order, and a structure in which only a ferromagnetic metal layer (the second ferromagnetic metal layer) is stacked on the spin-orbit torque wiring may also be used.

Figure 5:
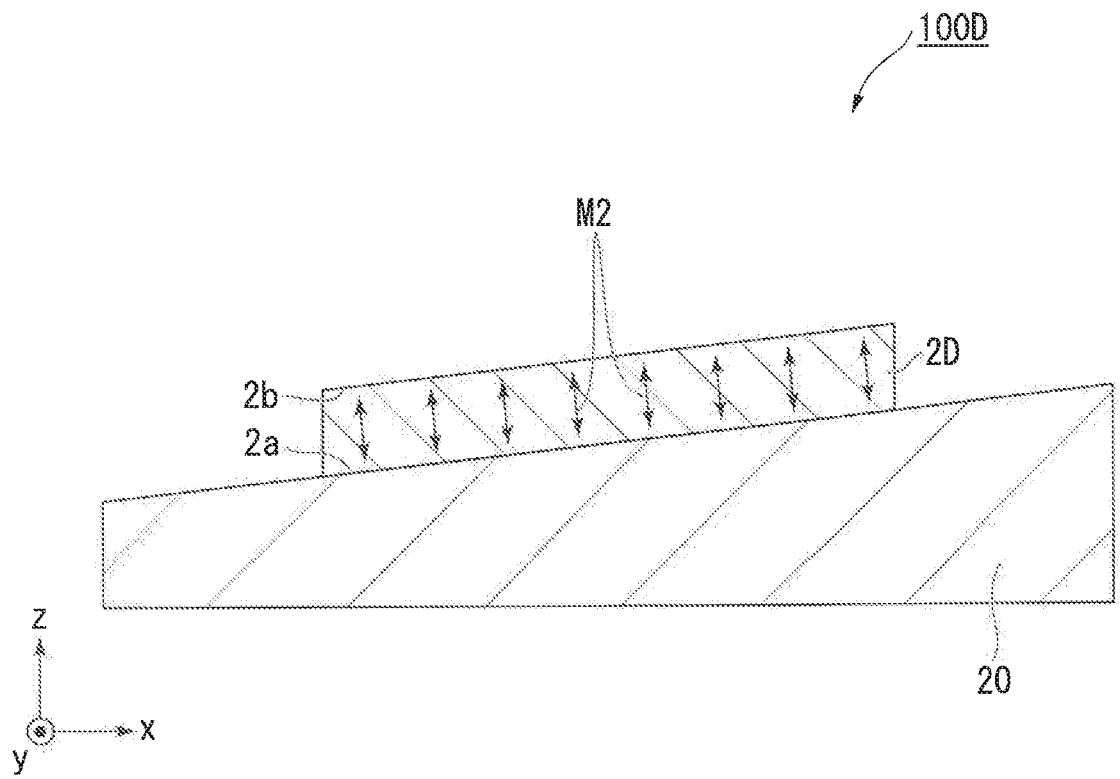
FIG. 5 is a schematic cross sectional view of a spin current magnetization reversal element in which only a ferromagnetic metal layer (second ferromagnetic metal layer) is stacked on the spin-orbit torque wiring.

FIG. 5 is a schematic cross sectional view of a spin current magnetization reversal element in which only a ferromagnetic metal layer (the second ferromagnetic metal layer) is stacked on the spin-orbit torque wiring. The spin current magnetization reversal element 100D illustrated in FIG. 5 includes a ferromagnetic metal layer 2D, and the spin-orbit torque wiring 20 which is joined to one surface of the ferromagnetic metal layer 2D. At least one surface of the ferromagnetic metal layer 2D in the z-direction forms an inclined surface that is inclined in the x-direction.

The spin current magnetization reversal element 100D illustrated in FIG. 5 corresponds with a structure in which the non-magnetic layer 3 and the first ferromagnetic metal layer 1 have been removed from the spin current magnetization reversal element 100 illustrated in FIG. 1. Even without the non-magnetic layer 3 and the first ferromagnetic metal layer 1, the spin current magnetization reversal element 100D still functions, for example, as an AMR (anisotropic magnetoresistance) sensor, or an element that utilizes the magnetic Kerr effect or the magnetic Faraday effect. Because the x-direction symmetry of the spin current magnetization reversal element 100D is also disturbed in a similar manner to described above, the magnetization of the ferromagnetic metal layer 2D can undergo magnetic reversal in the absence of a magnetic field.

(Method for Producing Spin Current Magnetization Reversal Element)

Next is a description of a method for producing the spin current magnetization reversal element.

Production of the spin current magnetization reversal element 100 illustrated in FIG. 1 includes a step of stacking the magnetoresistance effect element 10 on the spin-orbit torque wiring 20. Production of the spin current magnetization reversal element 100D illustrated in FIG. 5 includes a step of stacking the ferromagnetic metal layer 2D on the spin-orbit torque wiring 20. Further, prior to these layer stacking steps, an inclined surface is formed on the spin-orbit torque wiring 20. By stacking the magnetoresistance effect element 10 on the spin-orbit torque wiring 20 having this inclined surface, an inclined surface that is inclined in a first direction is formed on either one surface or both surfaces of the second ferromagnetic metal layer 2.

Figure 6A:
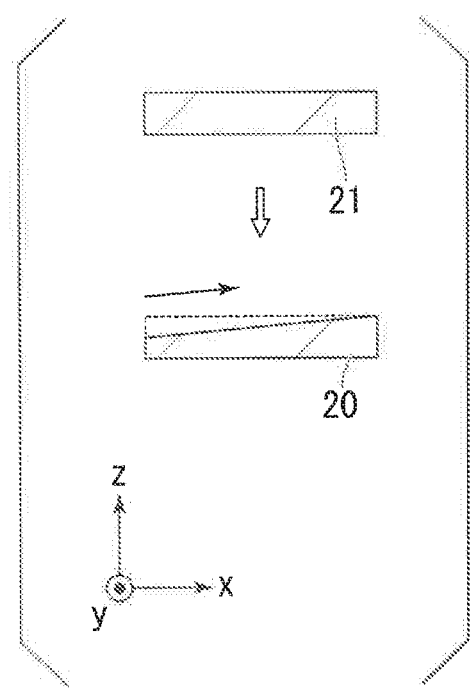
FIG. 6A is a diagram schematically illustrating part of a method for producing a spin current magnetization reversal element according to the first embodiment.
Figure 6B:
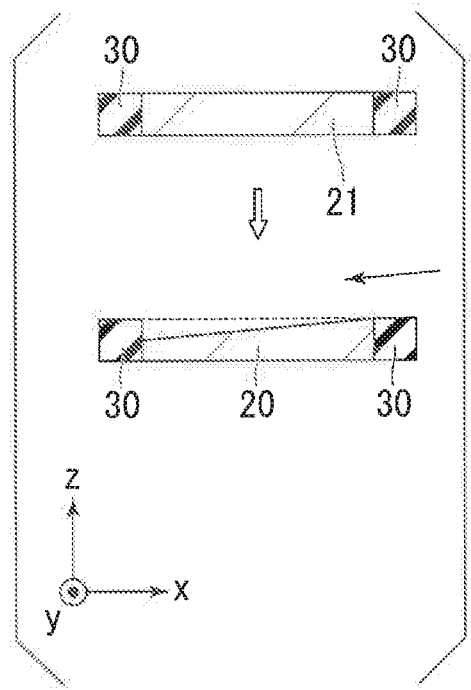
FIG. 6B is a diagram schematically illustrating part of a method for producing a spin current magnetization reversal element according to the first embodiment.
Figure 6C:
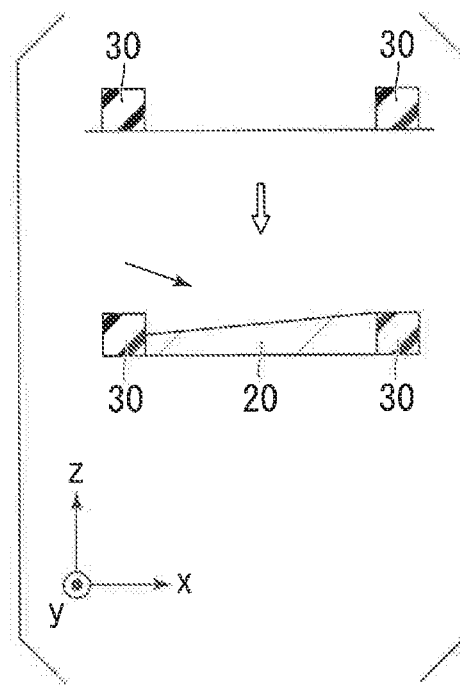
FIG. 6C is a diagram schematically illustrating part of a method for producing a spin current magnetization reversal element according to the first embodiment.

First, an inclined surface is formed on the spin-orbit torque wiring 20. The inclined surface can be obtained by any of the following three methods. FIGS. 6A to 6C are a diagram schematically illustrating part of the method for producing a spin current magnetization reversal element according to the first embodiment, and shows the method for fabricating the spin-orbit torque wiring 20.

As illustrated in FIG. 6A, the first method is a method in which the stacked spin-orbit torque wiring is fabricated by polishing along the x-direction.

First, the spin-orbit torque wiring 21 is deposited on a substrate (not shown in the figure). Conventional methods can be used as the deposition method, including sputtering methods, vapor deposition methods, laser ablation methods and MBE methods. The stacked surface of the deposited spin-orbit torque wiring 21 is parallel with the xy-plane, and is not inclined.

The surface of the spin-orbit torque wiring 21 on the opposite side from the substrate is polished. Chemical mechanical polishing (CMP) or the like can be used for the polishing. The polishing is performed anisotropically. Specifically, polishing is performed along the x-direction, from a first end portion in the x-direction to the opposing second end portion.

Generally, when polishing is performed along a single direction, a large force is applied in the initial stages of the polishing pad contacting the polishing target, and therefore the first end portion where the polishing is started is eroded to a greater extent than the second end portion. As a result, by performing repeated anisotropic polishing, a spin-orbit torque wiring 20 having the type of inclined surface illustrated in FIG. 6A is formed.

As illustrated in FIG. 6B, the second method is a method in which the stacked spin-orbit torque wiring is fabricated by anisotropic etching along the x-direction.

The procedure through to the deposition of the spin-orbit torque wiring 21 is the same as that described for the first method. A protective body 30 is then installed at both x-direction side surfaces of the fabricated spin-orbit torque wiring 21. There are no particular limitations on the material for the protective body 30, provided it has a higher degree of hardness than the material that constitutes the spin-orbit torque wiring 21.

Next, etching of the spin-orbit torque wiring 21 is performed in a direction inclined in the x-direction. Examples of etching techniques that may be used include ion milling and reactive ion etching (RIE).

The protective body 30 has a higher degree of hardness than the spin-orbit torque wiring 21, and is resistant to etching. Accordingly, when ions or the like strike the spin-orbit torque wiring 21 from a direction that is inclined in the x-direction, the portion hidden in the shadow of the protective body 30 does not undergo etching (the shadow effect). As a result, etching having anisotropy in the x-direction is achieved, and the spin-orbit torque wiring 20 having an inclined surface in the x-direction is formed. The angle of the inclined surface can be controlled freely by altering the angle at which the ions or gas or the like used in the etching contact the spin-orbit torque wiring.

As illustrated in FIG. 6C, the third method is a method in which the spin-orbit torque wiring 21 is fabricated by anisotropic deposition.

First, a protective body 30 is installed on the substrate so as to surround the portion in which the spin-orbit torque wiring 20 is to be formed. Deposition is performed from a direction inclined toward the x-direction from a direction perpendicular to the substrate. Conventional methods can be used as the deposition method, including sputtering methods, vapor deposition methods, laser ablation methods and MBE methods.

Deposition proceeds more slowly in the portion that is hidden in the shadow of the protective body 30 (the shadow effect). As a result, deposition proceeds with anisotropy in the x-direction, meaning the spin-orbit torque wiring 20 having an inclined surface in the x-direction is obtained. The angle of the inclined surface can be controlled freely by adjusting the angle of the target relative to the substrate, thereby altering the angle at which the particles make contact with the substrate.

The spin current magnetization reversal element 100 is then fabricated by stacking the second ferromagnetic metal layer 2, the non-magnetic layer 3 and the first ferromagnetic metal layer 1, in that order, on the spin-orbit torque wiring 20 having an inclined surface obtained using one of the methods described above. Further, in the case of fabricating the spin current magnetization reversal element 100D illustrated in FIG. 5, the ferromagnetic metal layer 2D is stacked on the spin-orbit torque wiring 20 having an inclined surface. Conventional methods such as sputtering methods, vapor deposition methods, laser ablation methods and MBE methods can be used as the deposition method. Because each of the layers of the magnetoresistance effect element 10 reflect the inclined surface of the spin-orbit torque wiring 20, an inclined surface is formed on the second ferromagnetic metal layer 2.

Furthermore, as illustrated in FIG. 3A to FIG. 3C, in some cases each of the layers of the magnetoresistance effect element 10 may not necessarily reflect the shape of the stacking surface of the spin-orbit torque wiring. In such cases, one of the three methods described above is used in the process of stacking the magnetoresistance effect element 10. For example, the structure illustrated in FIG. 3A can be achieved by stacking the second ferromagnetic metal layer 2 in a manner that reflects the shape of the spin-orbit torque wiring 20, and then subjecting the stacked surface to polishing or the like.

As outlined above, by using the method for producing a spin current magnetization reversal element according to the present embodiment, an inclined surface can be formed on any arbitrary surface. As a result, a "symmetry break" can be created in the magnetoresistance effect element, and a spin current magnetization reversal element can be obtained for which magnetization reversal of the free layer magnetization can be achieved without the application of an external force such as an external magnetic field or the like.

Second Embodiment

Figure 7:
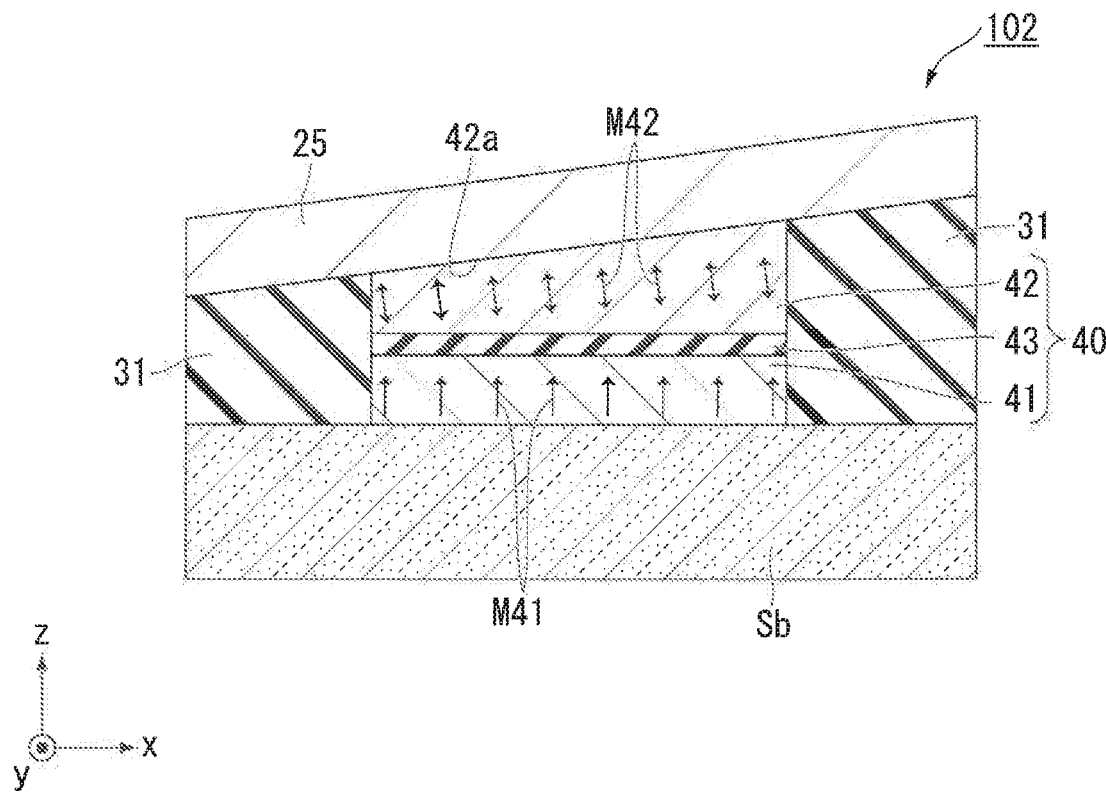
FIG. 7 is a diagram schematically illustrating a cross section of a spin current magnetization reversal element according to a second embodiment.

FIG. 7 is a cross sectional diagram schematically illustrating a spin current magnetization reversal element according to a second embodiment.

The spin current magnetization reversal element 102 according to the second embodiment differs from the spin current magnetization reversal element 100 according to the first embodiment in terms of the bottom pin structure.

The spin current magnetization reversal element 102 according to the second embodiment has a magnetoresistance effect element 40 and spin-orbit torque wiring 25, in that order, on a substrate Sb. An insulating portion 31 is provided around the outer periphery of the magnetoresistance effect element 40.

The magnetoresistance effect element 40 has a bottom pin structure having a first ferromagnetic metal layer 41, a non-magnetic layer 43 and a second ferromagnetic metal layer 42 stacked in order from the side of the substrate Sb. The first ferromagnetic metal layer 41, the non-magnetic layer 43 and the second ferromagnetic metal layer 42 may use the same materials and structures as those described for the first embodiment.

The surface of the second ferromagnetic metal layer 42 on the side facing the spin-orbit torque wiring 25 is an inclined surface 42a that is inclined in the x-direction. Accordingly, the magnetization M42 of the second ferromagnetic metal layer 42 is affected by the inclined surface 42a, and is inclined in the x-direction. In contrast, the magnetization M41 of the first ferromagnetic metal layer 41 is oriented in the z-direction.

The spin-orbit torque wiring 25 is similar to the first embodiment in terms of being disposed on the magnetoresistance effect element 40 on the side facing the second ferromagnetic metal layer 42. On the other hand, because the stacking order of the magnetoresistance effect element 40 is reversed, the fact that the spin-orbit torque wiring 25 is arranged on top of the magnetoresistance effect element 40 in the z-direction is different. The same materials and structures as those described for the first embodiment can be used for the spin-orbit torque wiring 25.

The insulating portion 31 is a support portion enabling the spin-orbit torque wiring 25 to be provided on the top of the magnetoresistance effect element 40. There are no particular limitations on the insulating portion 31, provided it has insulating properties.

The spin current magnetization reversal element 102 according to the second embodiment is operated by spin injected into the magnetoresistance effect element 40 from the spin-orbit torque wiring 25.

In the spin current magnetization reversal element 102 according to the second embodiment, the magnetization M42 is inclined in the x-direction due to the inclined surface 42a of the second ferromagnetic metal layer 42. In other words, in a state where no external magnetic field is applied, the symmetry of the magnetization M42 is disturbed. As a result, the magnetization M42 interacts with the spin injected into the magnetoresistance effect element 40, and can receive the torque (SOT) that acts as a trigger for magnetization reversal.

As described above, by using the spin current magnetization reversal element 102 according to the second embodiment, the magnetization M42 of the second ferromagnetic metal layer 42 (the free layer) of the magnetoresistance effect element 40 can be reversed without applying an external force such as an external magnetic field. This is because the magnetization M42 is inclined in the x-direction in accordance with the shape anisotropy, generating a "symmetry break" in the magnetoresistance effect element 40.

The present embodiment is not necessarily limited to the structure described above, and various modifications are possible without departing from the object of the embodiment.

Figure 8A:
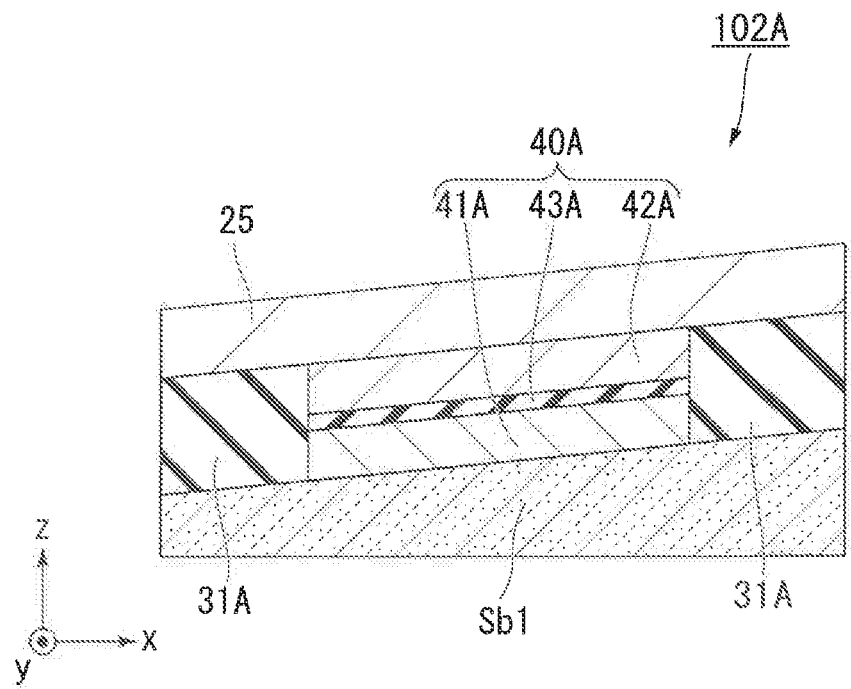
FIG. 8A is a series of diagrams schematically illustrating cross sections of other examples of spin current magnetization reversal elements according to the second embodiment.
Figure 8B:
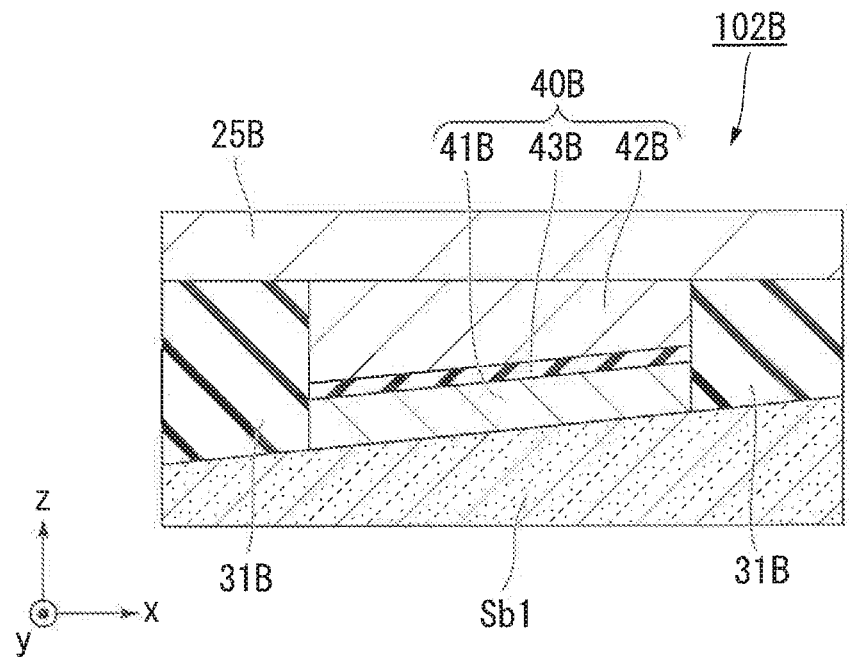
FIG. 8B is a series of diagrams schematically illustrating cross sections of other examples of spin current magnetization reversal elements according to the second embodiment.

FIG. 8A and FIG. 8B are a series of diagrams schematically illustrating cross sections of other examples of spin current magnetization reversal elements according to the second embodiment.

A spin current magnetization reversal element 102A illustrated in FIG. 8A differs from the spin current magnetization reversal element 102 illustrated in FIG. 7 in that inclined surfaces are provided on both surfaces of a second ferromagnetic metal layer 42A.

The spin current magnetization reversal element 102A illustrated in FIG. 8A has a magnetoresistance effect element 40A and the spin-orbit torque wiring 25 on a substrate Sb1. An insulating portion 31A is provided around the outer periphery of the magnetoresistance effect element 40A. The surface of the substrate Sb1 on the side facing the magnetoresistance effect element 40A is inclined, and a first ferromagnetic metal layer 41A, the second ferromagnetic metal layer 42A and a non-magnetic layer 43A of the magnetoresistance effect element 40A are all inclined.

In the spin current magnetization reversal element 102A illustrated in FIG. 8A, the directions of orientation of the magnetizations of the first ferromagnetic metal layer 41A and the second ferromagnetic metal layer 42A are aligned, and a large MR ratio can be achieved.

A spin current magnetization reversal element 102B illustrated in FIG. 8B differs from the spin current magnetization reversal element 102 illustrated in FIG. 7 in that an inclined surface is provided on the surface of a second ferromagnetic metal layer 42B on the side of the substrate Sb1. Further, the fact that the spin-orbit torque wiring 25B is not inclined in the x-direction differs from the spin current magnetization reversal element 102A illustrated in FIG. 8A.

The spin current magnetization reversal element 102B illustrated in FIG. 8B has a magnetoresistance effect element 40B and the spin-orbit torque wiring 25B on the substrate Sb1. An insulating portion 31B is provided around the outer periphery of the magnetoresistance effect element 40B. The magnetoresistance effect element 40B has a first ferromagnetic metal layer 41B, a non-magnetic layer 43B and the second ferromagnetic metal layer 42B stacked in order from the side of the substrate Sb1.

In a similar manner to that described for the spin current magnetization reversal element according to the first embodiment, the spin current magnetization reversal element according to the second embodiment may also have a structure that does not include the first ferromagnetic metal layer 41A and the non-magnetic layer 43A.

The spin current magnetization reversal element according to the second embodiment can be fabricated in the manner described below. This fabrication is described below in detail using the spin current magnetization reversal element 102 illustrated in FIG. 7 as an example.

The method for producing the spin current magnetization reversal element 102 according to the second embodiment has a step of stacking the spin-orbit torque wiring 25 on top of the magnetoresistance effect element 40. The inclined surface is fabricated following stacking of the magnetoresistance effect element 40.

The inclined surface 42a of the second ferromagnetic metal layer 42 is obtained by performing any one of polishing, anisotropic etching or anisotropic deposition along the x-direction, in a similar manner to that described in the first embodiment. The insulating portion 31 may also function as the protective body 30 required during anisotropic etching or anisotropic deposition.

As illustrated in FIG. 8A and FIG. 8B, an inclined surface may be formed on the surface of the substrate Sb1 on which the magnetoresistance effect element 40A or 40B is stacked, thereby introducing an inclined surface to the second ferromagnetic metal layer 42A or 42B. The surface of the magnetoresistance effect element 40B on the side facing the spin-orbit torque wiring 25 in FIG. 8B is obtained by performing polishing in a direction parallel to the xy-plane.

Third Embodiment

Figure 9:
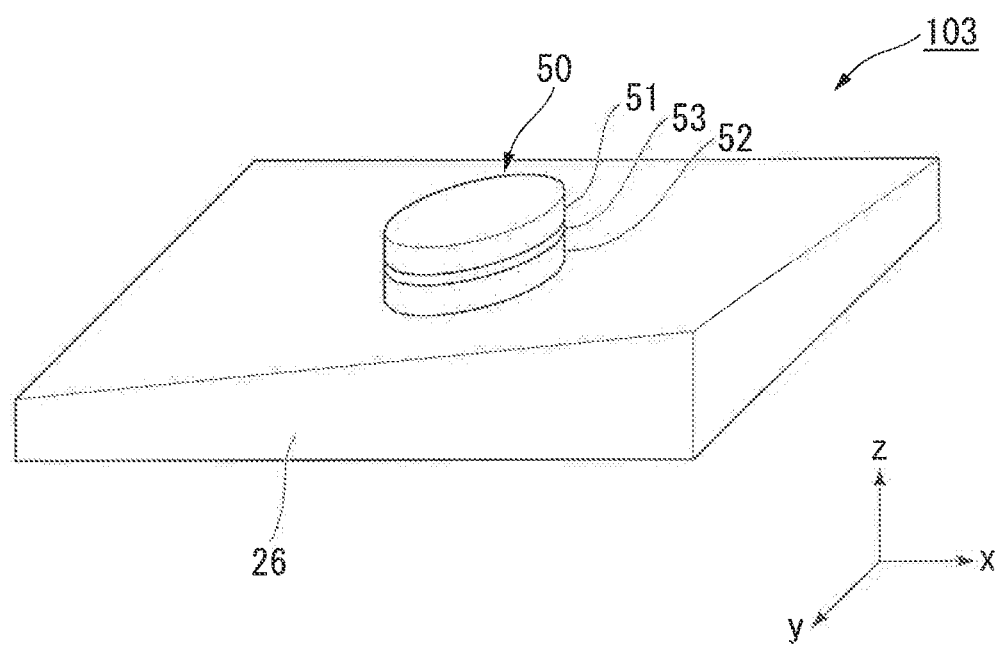
FIG. 9 is a perspective view schematically illustrating a spin current magnetization reversal element according to a third embodiment.
Figure 10A:
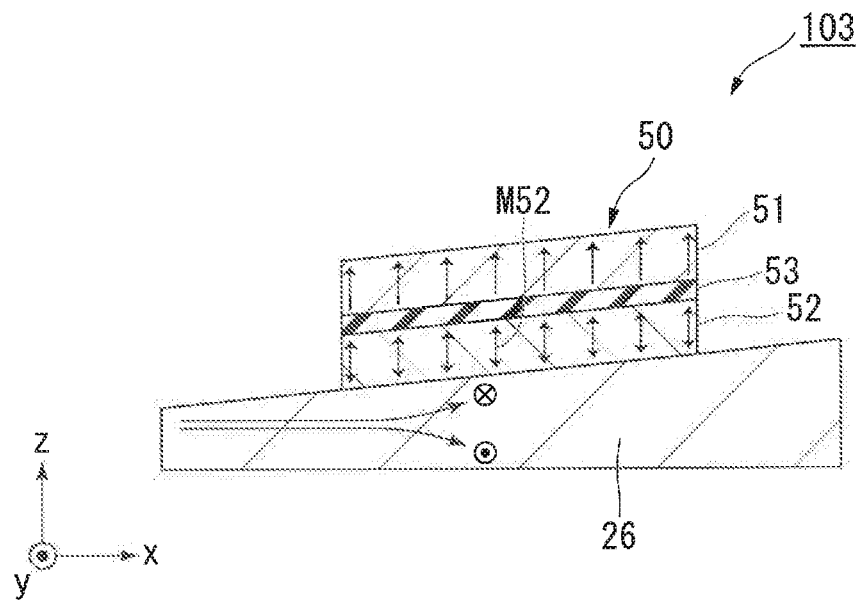
FIG. 10A is a series of diagrams schematically illustrating cross sections of a spin current magnetization reversal element according to the third embodiment.
Figure 10B:
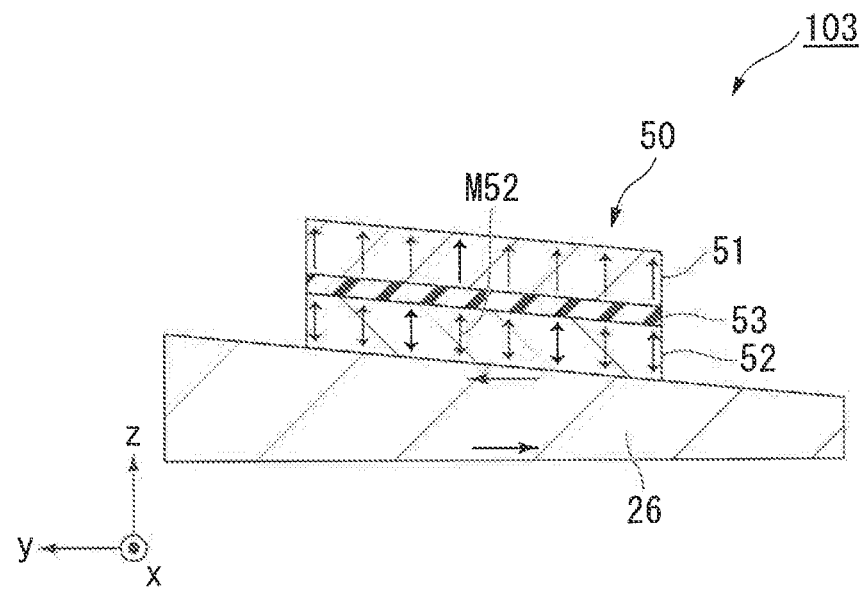
FIG. 10B is a series of diagrams schematically illustrating cross sections of a spin current magnetization reversal element according to the third embodiment.

FIG. 9 is a perspective view schematically illustrating a spin current magnetization reversal element according to a third embodiment. Further, FIG. 10A and FIG. 10B are a series of cross sectional views of the spin current magnetization reversal element according to the third embodiment. FIG. 10A is a cross sectional view through the xz-plane, and FIG. 10B is a cross sectional view through the yz-plane.

A spin current magnetization reversal element 103 according to the third embodiment differs from the spin current magnetization reversal element 100 according to the first embodiment in that a magnetoresistance effect element 50 is also inclined in the y-direction.

The spin current magnetization reversal element 103 according to the third embodiment has spin-orbit torque wiring 26 and the magnetoresistance effect element 50. The magnetoresistance effect element 50 has a second ferromagnetic metal layer 52, a non-magnetic layer 53 and a first ferromagnetic metal layer 51 stacked in that order from the side of the spin-orbit torque wiring 26. The same materials and the like described in the first embodiment can be used for the spin-orbit torque wiring 26, the second ferromagnetic metal layer 52, the non-magnetic layer 53 and the first ferromagnetic metal layer 51.

The spin-orbit torque wiring 26 differs from the wiring of the first embodiment in that it is inclined not only in the x-direction, but also in the y-direction. Accordingly, the second ferromagnetic metal layer 52 of the magnetoresistance effect element 50 stacked on the spin-orbit torque wiring 26 is also inclined in both the x-direction and the y-direction. As a result, the magnetization M52 of the second ferromagnetic metal layer 52 is also inclined in both the x-direction and the y-direction.

In the spin current magnetization reversal element 103 according to the third embodiment, the magnetization M52 is inclined in the x-direction and the y-direction due to the inclined surface of the second ferromagnetic metal layer 52. In order to achieve magnetic reversal by SOT without applying an external magnetic field, the symmetry of the magnetization M52 must be disturbed. In the spin current magnetization reversal element 103 according to the third embodiment, the magnetization is disturbed not only in the x-direction, but also in the y-direction, and therefore magnetization reversal can be achieved even more easily.

Further, in a similar manner to the spin current magnetization reversal element according to the first embodiment, the spin current magnetization reversal element according to the third embodiment may also have a structure that does not include the first ferromagnetic metal layer 51 and the non-magnetic layer 53.

Fourth Embodiment

Figure 11:
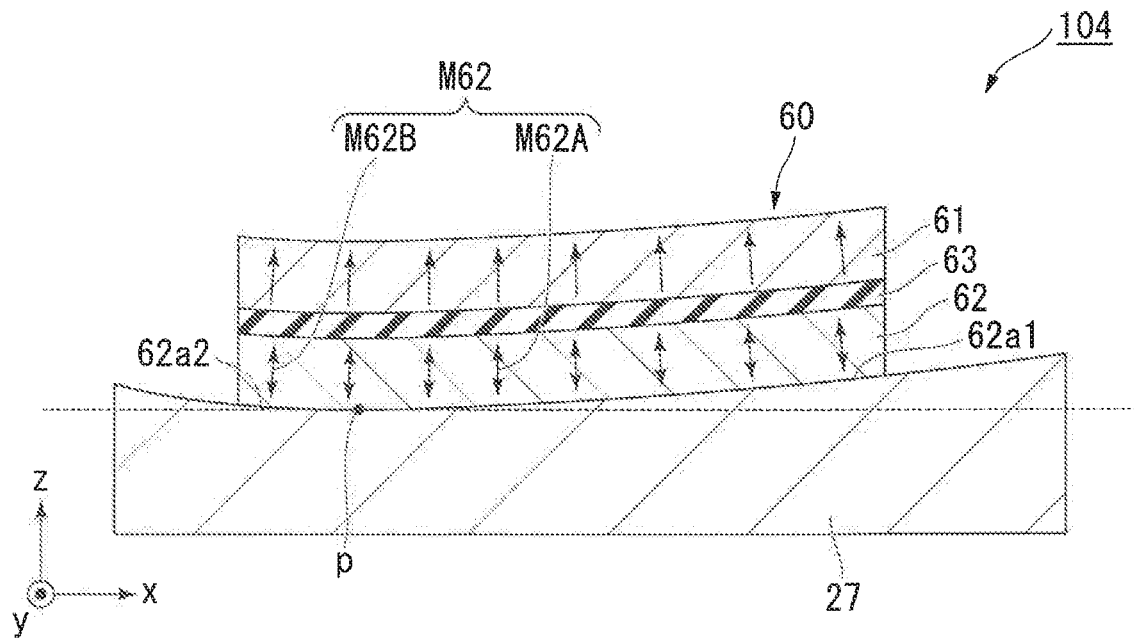
FIG. 11 is a diagram schematically illustrating a cross section of a spin current magnetization reversal element according to a fourth embodiment.

FIG. 11 is a cross sectional view schematically illustrating a spin current magnetization reversal element according to a fourth embodiment. A spin current magnetization reversal element 104 according to the fourth embodiment differs from the spin current magnetization reversal element 100 according to the first embodiment in that the inclined surface of a second ferromagnetic metal layer 62 of a magnetoresistance effect element 60 has a first inclined surface 62a1 and a second inclined surface 62a2.

The spin current magnetization reversal element 104 illustrated in FIG. 11 has spin-orbit torque wiring 27 and a magnetoresistance effect element 60. The spin-orbit torque wiring 27 and the magnetoresistance effect element 60 may use the same materials and structures as those described in the first embodiment.

In the spin-orbit torque wiring 27, the stacking surface on which the magnetoresistance effect element 60 is stacked is recessed in the z-direction. The second ferromagnetic metal layer 62, a non-magnetic layer 63 and a first ferromagnetic metal layer 61 that constitute the magnetoresistance effect element 60 reflect the shape of the stacking surface of the spin-orbit torque wiring 27.

The second ferromagnetic metal layer 62 illustrated in FIG. 11 has inclined 241 surfaces on both surfaces in the z-direction. One of the inclined surfaces is composed of the first inclined surface 62a1 and the second inclined surface 62a2. The first inclined surface 62a1 and the second inclined surface 62a2 are inclined with different positive and negative inclination angles relative to the xy-plane (the reference plane). In FIG. 11, relative to an inflection portion p at the boundary between the first inclined surface 62a1 and the second inclined surface 62a2, the first inclined surface 62a1 has a positive inclination in the z-direction relative to the xy-plane, and the second inclined surface 62a2 has a negative inclination in the z-direction relative to the xy-plane.

The orientation of the magnetization M62 of the second ferromagnetic metal layer 62 is affected by the first inclined surface 62a1 and the second inclined surface 62a2. Magnetization M62A in the vicinity of the first inclined surface 62a1 is oriented with an inclination toward the negative x-direction from the z-direction, whereas magnetization M62B in the vicinity of the second inclined surface 62a2 is oriented with an inclination toward the positive x-direction from the z-direction. Accordingly, even in a state where an external magnetic field is not applied, the symmetry of each of the magnetizations M62A and M62B is disturbed.

In the spin current magnetization reversal element 104, the surface area of the first inclined surface 62a1 is larger than that of the second inclined surface 62a2. In the cross section illustrated in FIG. 11, the location of the inflection portion p is displaced relative to the central point in the x-direction of the magnetoresistance effect element 60.

Because the surface area of the first inclined surface 62a1 is larger than that of the second inclined surface 62a2, the magnetization M62A that is oriented under the effect of the first inclined surface 62a1 predominates. In other words, the symmetry of the overall magnetization M62 of the second ferromagnetic metal layer 62 is also disturbed from a macro viewpoint. As a result, the magnetization M62 can interact with the spin injected into the magnetoresistance effect element 60, thereby receiving the torque (SOT) that acts as a trigger for magnetization reversal.

The first inclined surface 62a1 and the second inclined surface 62a2 tend to be formed easily when the inclined surface is fabricated by polishing. This is because those portions to which excess force is applied tend to become slightly recessed.

As described above, in the spin current magnetization reversal element 104 according to the fourth embodiment, the magnetization M62 of the second ferromagnetic metal layer 62 (the free layer) of the magnetoresistance effect element 60 can be reversed even without applying an external force such as an external magnetic field. This is because the magnetization M62 is inclined in the x-direction in accordance with the shape anisotropy, generating a "symmetry break" in the magnetoresistance effect element 60.

Structures in which the inclined surface has a first inclined surface and a second inclined surface are not limited to the structure of FIG. 11. For example, the structure of a spin current magnetization reversal element 105 illustrated in FIG. 12 is possible.

Figure 12:
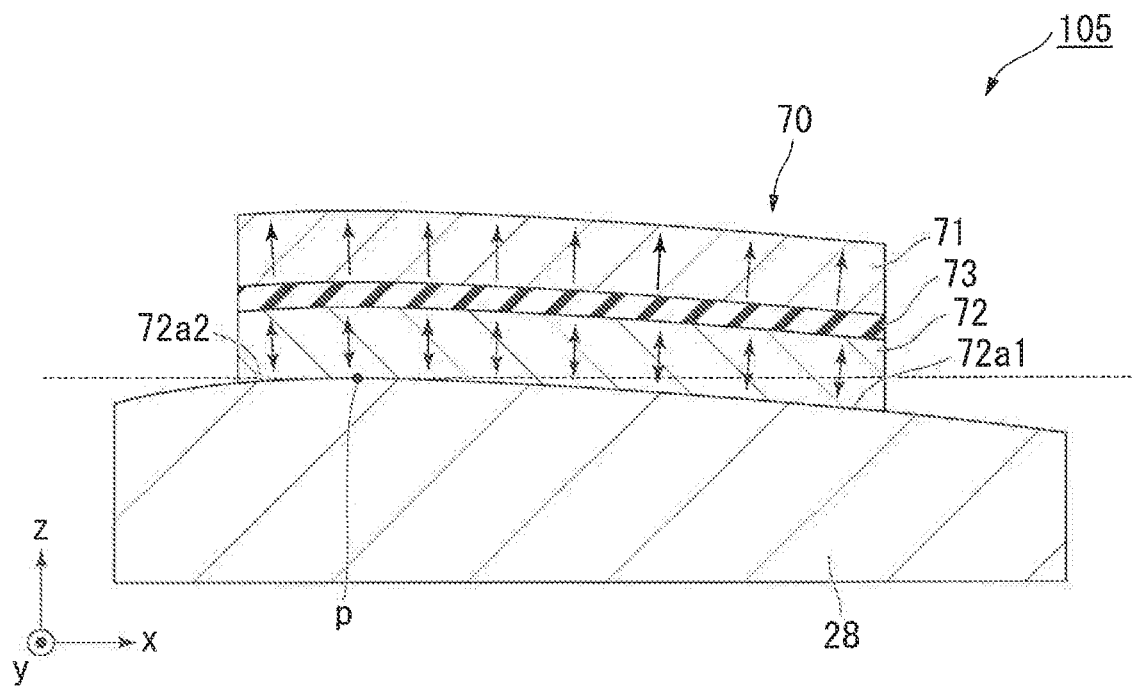
FIG. 12 is a diagram schematically illustrating a cross section of another example of a spin current magnetization reversal element according to the fourth embodiment.

The spin current magnetization reversal element 105 illustrated in FIG. 12 has spin-orbit torque wiring 28 and a magnetoresistance effect element 70. In the spin-orbit torque wiring 28, the stacking surface on which the magnetoresistance effect element 70 is stacked has a convex shape in the z-direction. A second ferromagnetic metal layer 72, a non-magnetic layer 73 and a first ferromagnetic metal layer 71 that constitute the magnetoresistance effect element 70 reflect the shape of the stacking surface of the spin-orbit torque wiring 28. Accordingly, a first inclined surface 72a1 and a second inclined surface 72a2 are formed on the second ferromagnetic metal layer 72.

Further, in a similar manner to the spin current magnetization reversal element according to the first embodiment, the spin current magnetization reversal element according to the fourth embodiment may also have a structure that does not include the first ferromagnetic metal layer 61 or 71 and the non-magnetic layer 63 or 73.

(Element Assembly)

Figure 13:
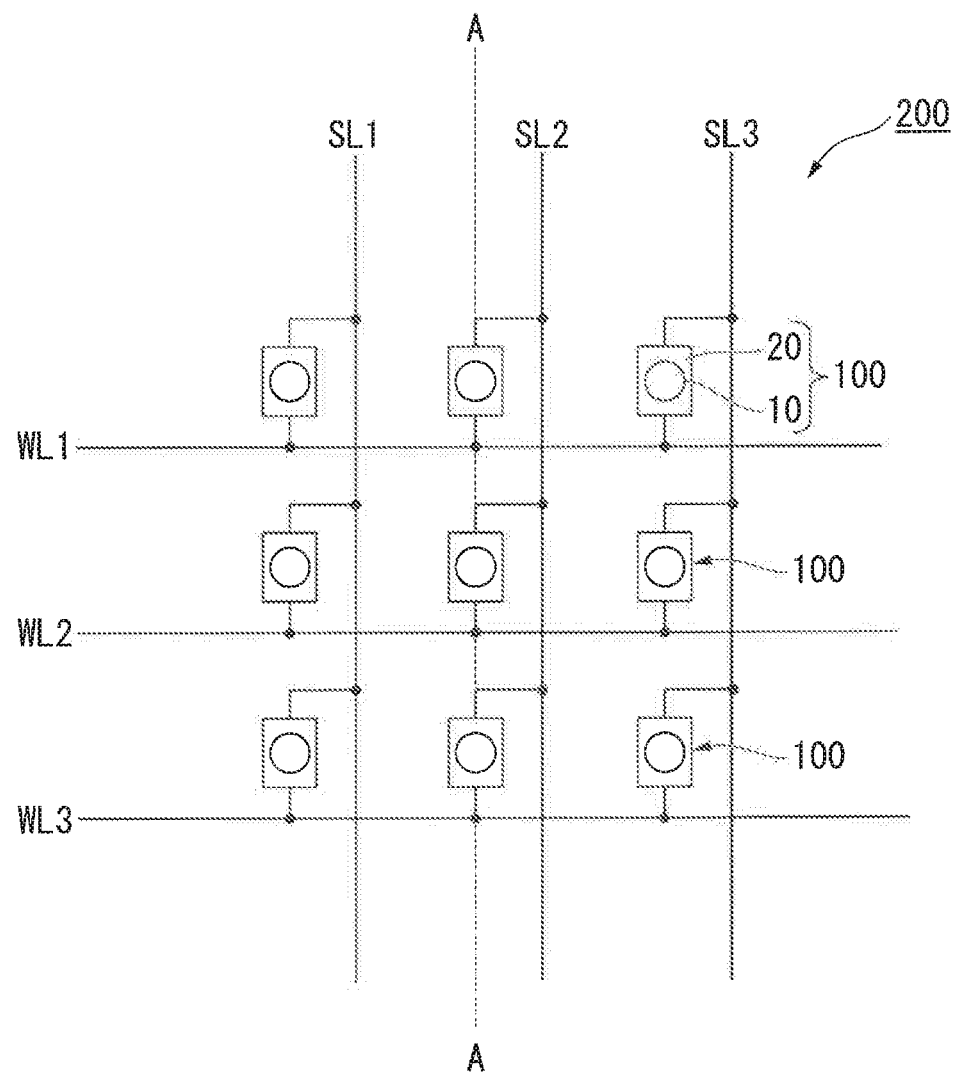
FIG. 13 is a diagram schematically illustrating an element assembly containing a plurality of spin current magnetization reversal elements.

FIG. 13 is a diagram schematically illustrating an element assembly 200 containing a plurality of spin current magnetization reversal elements 100. In the element assembly 200 illustrated in FIG. 13, the spin current magnetization reversal elements 100 are arranged in a 3×3 matrix. FIG. 13 is merely one example of an element assembly, and the number and arrangement of the spin current magnetization reversal elements 100 are arbitrary.

Each of the spin current magnetization reversal elements 100 is connected to one word line WL1 to WL3 and one source line SL1 to SL3. By selecting one of the word lines WL1 to WL3 and one of the source lines SL1 to SL3 for current application, an electric current can be passed through the spin-orbit torque wiring 20 of any arbitrary spin current magnetization reversal element 100.

When a current flows through the spin-orbit torque wiring 20, the magnetization of the free layer of the magnetoresistance effect element 10 reverses as a result of the SOT effect. In this manner, data can be written to any arbitrary element among the plurality of spin current magnetization reversal elements 100.

Figure 14:
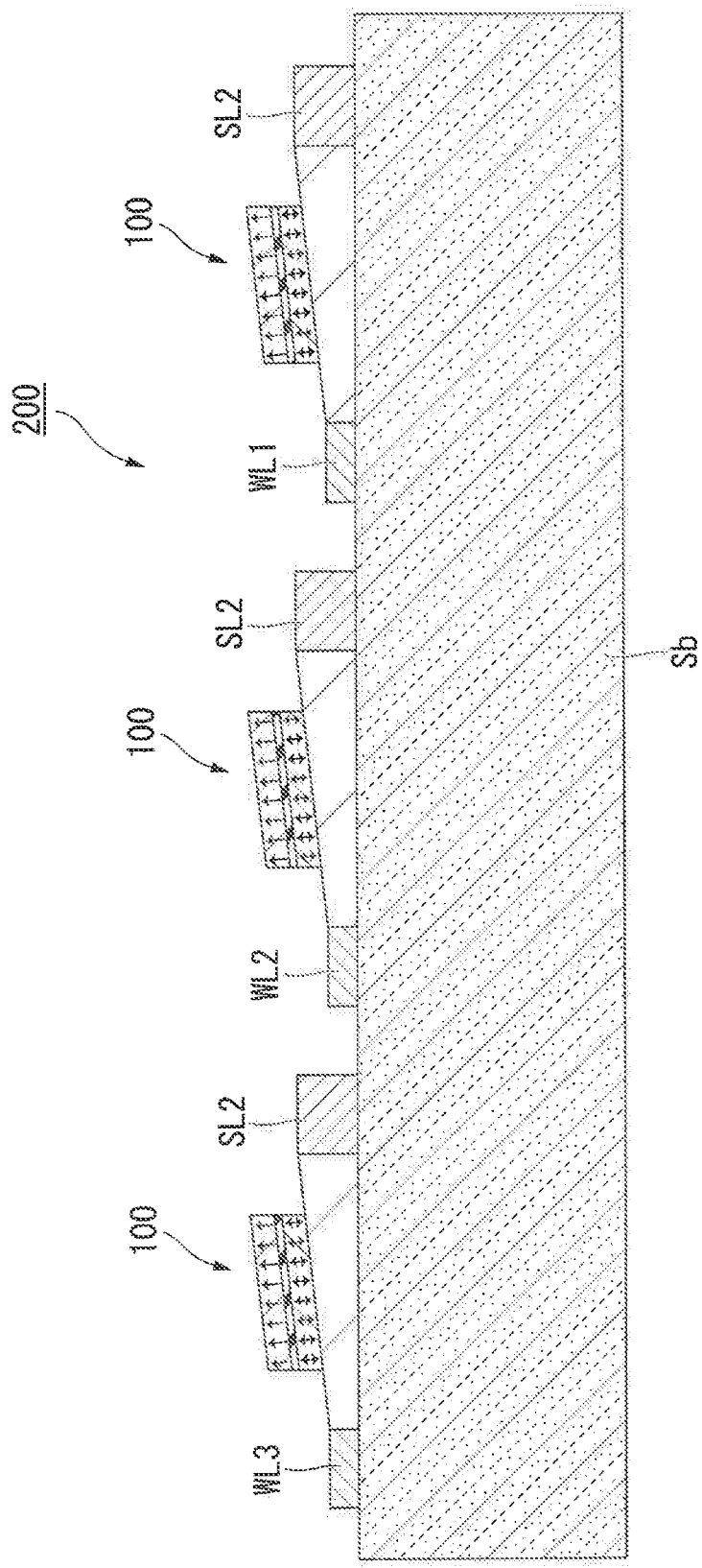
FIG. 14 is a diagram schematically illustrating a cross section, cut along the line A-A in FIG. 13, of the element assembly containing a plurality of spin current magnetization reversal elements.

FIG. 14 is a diagram schematically illustrating a cross section, cut along the line A-A in FIG. 13, of the element assembly containing the plurality of spin current magnetization reversal elements.

It is preferable that, as illustrated in FIG. 14, the inclined surfaces of the plurality of spin current magnetization reversal elements 100 are inclined in the same direction. If the inclination directions of the various spin current magnetization reversal elements 100 differ, then wiring cannot be connected to each of the spin current magnetization reversal elements 100 from the same direction, making the wiring configuration more complex.

In contrast, if each of the spin current magnetization reversal elements 100 that constitute the element assembly 200 has the same structure, then the word lines WL1 to WL3 and the source lines SL1 to SL3 connected to each of the elements can have the same form. In other words, an increase in the complexity of the wiring configuration of the element assembly 200 can be avoided, and the degree of integration of the element assembly 200 can be enhanced.

DESCRIPTION OF THE REFERENCE SIGNS

1, 1A, 1B, 1C, 11, 41, 41A, 41B, 51, 61, 71: First ferromagnetic metal layer
2, 2A, 2B, 12, 42, 42A, 42B, 52, 62, 72: Second ferromagnetic metal layer
3, 3A, 3B, 3C, 13, 43, 43A, 43B, 53, 63, 73: Non-magnetic layer
10, 10A, 10B, 10C, 15, 40, 40A, 40B, 50, 60, 70: Magnetoresistance effect element
20, 21, 22, 23, 24, 25, 25B, 26, 27, 28: Spin-orbit torque wiring
22A, 23A, 24A: Spin current generation portion
22B, 23B, 24B: Low-resistance portion
30: Protective body
31, 31A, 31B: Insulating portion
100, 100A, 100B, 100C, 100D, 101, 102, 102A, 102B, 103, 104, 105: Spin current magnetization reversal element
200: Element assembly
M1, M2, M12, M41, M42, M52, M62A, M62B, M62: Magnetization
1a, 1b, 2a, 2b, 42a: Inclined surface
62a1, 72a1: First inclined surface
62a2, 72a2: Second inclined surface
2Aa, 2Ba, 2Ca: First surface
2Ab, 2Bb, 2Cb: Second surface
S1: First spin
S2: Second spin
I: Electric current
$J_S$: Pure spin current
p: Inflection portion
Sb, Sb1: Substrate
WL1 to WL3: Word line
SL1 to SL3: Source line

What is claimed is:

1. A spin current magnetization reversal element comprising:
    a magnetoresistance effect element having a first ferromagnetic metal layer having a fixed magnetization direction, a second ferromagnetic metal layer having a variable magnetization direction, and a non-magnetic layer sandwiched between the first ferromagnetic metal layer and the second ferromagnetic metal layer, and
    spin-orbit torque wiring which extends in a first direction that intersects a stacking direction of the magnetoresistance effect element, and contacts a surface of the magnetoresistance effect element on a side facing the second ferromagnetic metal layer, wherein
    at least one surface of the second ferromagnetic metal layer in the stacking direction is an inclined surface that is inclined with respect to the first direction in an inclination direction,
    the inclined surface is also inclined in a second direction that intersects the stacking direction and the first direction, and
    the magnetization of the second ferromagnetic metal layer is oriented perpendicularly to the inclined surface.

2. The spin current magnetization reversal element according to claim 1,
    wherein a surface of the second ferromagnetic metal layer having the inclined surface has a first inclined surface and a second inclined surface that have different positive and negative inclination angles relative to a reference plane, and
    a surface area of the first inclined surface is greater than a surface area of the second inclined surface.

3. An element assembly comprising a plurality of spin current magnetization reversal elements according to claim 1.

4. The element assembly according to claim 3,
    wherein the inclined surfaces of the plurality of spin current magnetization reversal elements are inclined in the same direction.

5. A spin current magnetization reversal element comprising:
    a ferromagnetic metal layer, and
    spin-orbit torque wiring which extends in a first direction that intersects a stacking direction of the ferromagnetic metal layer, and contacts one surface of the ferromagnetic metal layer, wherein
    at least one surface of the ferromagnetic metal layer in the stacking direction has an inclined surface that is inclined in the first direction, and
    the magnetization of the ferromagnetic metal layer is oriented perpendicularly to the inclined surface.

6. A method for producing a spin current magnetization reversal element, the method having a stacking step of stacking a magnetoresistance effect element having a first ferromagnetic metal layer having a fixed magnetization direction, a second ferromagnetic metal layer having a variable magnetization direction and a non-magnetic layer sandwiched between the first ferromagnetic metal layer and the second ferromagnetic metal layer, and spin-orbit torque wiring which extends in a first direction, wherein
    either before or during the stacking step, an inclined surface that is inclined in the first direction is formed on at least one surface of the second ferromagnetic metal layer, and
    the magnetization of the second ferromagnetic metal layer is oriented perpendicularly to the inclined surface.

7. The method for producing a spin current magnetization reversal element according to claim 6,
    wherein the inclined surface is formed by polishing along the first direction.

8. The method for producing a spin current magnetization reversal element according to claim 6,
    wherein the inclined surface is formed by anisotropic etching along the first direction.

9. The method for producing a spin current magnetization reversal element according to claim 6,
    wherein the inclined surface is formed by anisotropic deposition along the first direction.

10. A method for producing a spin current magnetization reversal element, the method having a stacking step of stacking a ferromagnetic metal layer and spin-orbit torque wiring which extends in a first direction, wherein either before or during the stacking step, an inclined surface that is inclined in the first direction is formed on at least one surface of the ferromagnetic metal layer, and the magnetization of the ferromagnetic metal layer is oriented perpendicularly to the inclined surface.

\* \* \* \* \*